US006937480B2

(12) United States Patent
Iguchi et al.

(10) Patent No.: US 6,937,480 B2
(45) Date of Patent: Aug. 30, 2005

(54) PRINTED WIRING BOARD

(75) Inventors: Daisuke Iguchi, Ebina (JP); Joji Wakita, Ebina (JP); Kazumi Ikeda, Ebina (JP); Osamu Ueno, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 260 days.

(21) Appl. No.: 10/142,203

(22) Filed: May 10, 2002

(65) Prior Publication Data

US 2002/0176236 A1 Nov. 28, 2002

(51) Int. Cl.[7] .................................................. H05K 7/06

(52) U.S. Cl. ....................... 361/780; 361/794; 174/255; 174/262

(58) Field of Search ................................ 361/777, 778, 361/780, 793, 794; 174/255, 261, 262

(56) References Cited

U.S. PATENT DOCUMENTS

| | | | | |
|---|---|---|---|---|
| 4,551,747 A | * 11/1985 | Gilbert et al. | 257/691 |
| 5,068,631 A | * 11/1991 | Vince | 333/181 |
| 5,708,400 A | * 1/1998 | Morris | 333/12 |
| 5,898,576 A | * 4/1999 | Lockwood et al. | 361/782 |
| 6,137,168 A | * 10/2000 | Kirkman | 257/691 |
| 6,418,032 B2 | * 7/2002 | Hirata et al. | 361/780 |
| 6,477,057 B1 | * 11/2002 | Buffet et al. | 361/780 |
| 6,495,911 B1 | * 12/2002 | Buffet et al. | 257/700 |
| 6,573,600 B2 | * 6/2003 | Kikuchi et al. | 257/750 |
| 2003/0053302 A1 | * 3/2003 | Kelly et al. | 361/780 |

FOREIGN PATENT DOCUMENTS

| | | |
|---|---|---|
| JP | B2 7-46748 | 5/1995 |
| JP | B2 2734447 | 1/1998 |
| JP | A 11-233951 | 8/1999 |
| JP | A 11-330703 | 11/1999 |
| JP | B2 3036629 | 2/2000 |

OTHER PUBLICATIONS

Brian C. Wadell, "Transmission Line Design Handbook", Artech House, Inc., 1991, p. 79.

* cited by examiner

*Primary Examiner*—John B. Vigushin
(74) *Attorney, Agent, or Firm*—Oliff & Berridge, PLC

(57) ABSTRACT

A printed wiring board is provided which can be applied even to circuit boards operating at high speed, and which can suppress electromagnetic wave radiation, and which can suppress a deterioration in density of mounting. At the printed wiring board, a first signal wire layer, a first ground layer having a first power source wire, a second ground layer having a second power source wire, and a second signal wire layer, are laminated. The first ground layer and the second ground layer are interlayer connected by many via holes. Return current, of signal current flowing through a signal wire, flows in the first ground layer, and a path of the return current is cut midway therealong at a position of the first power source wire. However, the return current is detoured by the via hole to the second ground layer, and flows thereat.

19 Claims, 30 Drawing Sheets

PRINTED WIRING BOARD

BACKGROUND OF THE INVENTION

1. Field of the Invention

The present invention relates to a printed wiring board, and in particular, to a printed wiring board used in electronic equipment such as information equipment or the like.

2. Description of the Related Art

It is thought that electromagnetic noise, which is radiated from various types of electronic equipment such as information equipment or the like and which has been a problem in the conventional art, is mainly caused by clock signals on a printed wiring board, or by the signal wires of the digital signals which are synchronous with the clock signals. Various countermeasures for preventing electromagnetic radiation have been applied to the signal wires on a printed wiring board, the wire harnesses connected to the signal wires, and the like.

Countermeasures such as, for example, decreasing the slopes of the rise and fall of an output signal by adding a damping resistor or a filter to the signal output wire, or disposing a guard pattern of the ground electric potential in a vicinity of the signal wire so as to make the feedback current loop smaller, or the like, are generally carried out.

Further, there are cases in which an electromagnetic wave radiated from a printed wiring board has a frequency distribution which is different from that of an electromagnetic wave for which it can be predicted, from the current distribution on the signal wire, that the electromagnetic wave will be generated, and has a sharp peak at a specific frequency regardless of the properties of the signal wire. The main cause of generation of such an electromagnetic wave is known to be, as disclosed in Japanese Patent No. 3036629, not the signal wire of the printed wiring board, but the power source system, and is the electric resonance generated at the power layer and ground layer which oppose one another.

Thus, Japanese Patent No. 3036629 discloses a technique in which, in order to lower the reflectance of the resonance current at the end portions of a printed wiring board, a plurality of first capacitors are disposed at the end portions of the printed wiring board. Second capacitors, which are for suppressing the loop current which flows between the first capacitors and active elements such as ICs mounted on the printed wiring board, are connected to the power source terminals of the active elements, or are connected between the ground layer and the power layer in the vicinity of the power source terminal.

However, in the technique disclosed in Japanese Patent No. 3036629, due to the inductance caused by the capacitors themselves and by mounting the capacitors, the aforementioned effect is not achieved with respect to resonance current of high frequencies exceeding, for example, about 1 GHz. Further problems arise in that, at low frequency bands as well, it is not possible to completely eliminate the resonance current, and electromagnetic waves radiated from the end portions of the printed wiring board cannot be completely suppressed.

Moreover, the source of radiation of the electromagnetic waves caused by the power source system of the printed wiring board is the current which flows through the power source wires of a digital IC mounted on the printed wiring board, at the time of driving the digital IC. Thus, in the technique disclosed in Japanese Patent No. 2734447, to achieve the object of isolating the power source surface of the printed wiring board and the digital IC at high frequencies, in order to increase the high frequency impedance, branch wires, which are in zigzag forms or crossing forms or the like, are formed, and further, the insulating materials of both upper and lower sides of the power source surface are formed from a material which includes a magnetic body. In this way, the high frequency power source current which flows into the power source surface can be reduced.

Japanese Patent Application Publication (JP-B) No. 7-46748 discloses the following technique, which has similar effects as those of the technique disclosed in Japanese Patent No. 2734447. Namely, JP-B No. 7-46748 discloses providing a secondary power source surface, which is physically isolated from the main power source surface, at the printed wiring board. The main power source surface and the secondary power source surface are connected via a filter. The secondary power source surface is decoupled from the ground surface by a plurality of capacitors, and supplies power.

However, in the same way as the technique disclosed in Japanese Patent No. 3036629, with the techniques disclosed in Japanese Patent No. 2734447 and JP-B No. 7-46748, it is not possible to completely suppress the high frequency current flowing between the power source surface and the ground surface, nor is it possible to completely suppress the electromagnetic waves radiated from the end portions of the printed wiring board. Further, by providing the capacitors for decoupling at the secondary power source surface, the impedance between the main power source surface and the ground surface, which is a cause of electromagnetic wave radiation, conversely becomes greater. Thus, other capacitors must be provided at the main power source surface. Secondary problems thus arise in that the number of parts increases, and the stability of the electric potential at the ground surface deteriorates.

Namely, because many capacitors which couple the power source surface and the ground surface are added, a large number of opening portions (clearances), which are provided at the ground surface in order to allow passage of via holes which connect the capacitor pads and the power source surface, must be provided. It would be ideal for there to be no electric potential differences at the respective regions on the ground layer. However, because a plurality of opening portions are provided adjacent to one another, inductance is generated at the regions between the opening portions, and an electric potential difference arises at the both ends thereof. Moreover, because the metal region of the ground surface becomes smaller due to the provision of the many opening portions, the stability of the electric potential of the entire ground surface deteriorates.

Moreover, electromagnetic wave radiation of the printed wiring board due to common mode noise caused by the return current of the current flowing through the signal wire being incomplete, and radiation noise caused by the loop current, are also problematic.

Japanese Patent Application Laid-Open (JP-A) No. 11-233951 discloses a technique in which, in order to prevent the return current path of the current flowing through the signal wire from being cut-off due to the power layer being divided into the main power source surface and the secondary power source surface, the opposing power layer and ground layer are connected via capacitors, and the high-frequency return current is bypassed to the ground layer.

However, in this technique disclosed in JP-A No. 11-233951, the return current is bypassed by connecting, at high frequencies and by using two capacitors, the main power source surface and the secondary power source surface which are disposed at the same layer. Thus, the inductance component of the capacitors themselves, and the inductance component of the via holes for connecting the capacitors between the power layer and the ground layer or of the pads for connecting these via holes and the wires, are introduced in series into the return current path. Thus, the inductance cannot be made to be sufficiently low in the high frequency region of, for example, several GHz or more.

Moreover, JP-A No. 11-330703 discloses the following technique in a printed wiring board which is formed by a plurality of ground layers being disposed between a plurality of mixed layers in which signal wires and power source wires exist in the same layer. The plurality of ground layers are connected via a plurality of via holes, and the return current path at the time when current flows at the plurality of mixed layers is continuous. In this way, the loop formed by the return current is made smaller, and the electromagnetic wave radiation is thereby suppressed.

However, in this technique disclosed in JP-A No. 11-330703, the signal wires and the power source wires are disposed in the same layer. Thus, there are the problems that the degrees of freedom in design markedly decrease, and it is difficult to arrange, at a high density, the wires or the parts which operate at high speed which have come to be greatly desired in recent years. Moreover, in recent years, capacitors for decoupling or the like have been disposed in the vicinity of the device which is the source of the electromagnetic wave radiation when power is supplied by the wires, such that the transient current having the high frequency component is closed-in. Further, generally, a filter is provided so that the high frequency current cannot flow on the power source wires, and there is no need to consider the return current on the ground layer.

As described above, in a printed wiring board in which the power layer and the ground layer oppose one another and the surface area over which they oppose one another is large, electromagnetic wave radiation from the end portions of the board, which is caused by the resonance current flowing substantially symmetrically to the power layer and the ground layer, is dominant. However, for resonance current of high frequencies such as frequencies exceeding 1 GHz, the electromagnetic wave radiation from the end portions is not dominant. For resonance current of lower frequencies as well, electromagnetic wave radiation cannot be completely suppressed. On the other hand, the working speed of digital circuits in recent years has increased more and more, and frequencies have become higher and higher.

Further, in order to transmit high frequency signals on a printed wiring board, it is essential to lower the impedance of the signal wires, and to stabilize the electric potential on the ground source surface and the power source surface where the return current for the signal wires flows.

In a printed wiring board of a structure in which the power layer and the ground layer oppose one another and are disposed at the internal layers, in order to reduce the impedance of the signal wires, either the distance between the power layer and the ground layer must be made large, or plural power layers and ground layers must be provided. Problems arise in that, in the former case, the electromagnetic wave radiation due to the resonance current increases, and in the latter case, the costs increase.

In recent years, demands to increase the speed of circuits and to decrease the size of printed wiring boards have increased. Wire layers, in which the signal wires are wired, are completely filled up by the signal wires such as the bus lines and the like. Thus, in a case in which, in order to prevent electromagnetic wave radiation due to resonance current, wires for supplying power to the wire layers are provided without forming a power layer at the inner layers of the printed board, a problem arises in that the density of mounting decreases.

SUMMARY OF THE INVENTION

The present invention was developed in order to overcome the above-described problems, and an object of the present invention is to provide a printed wiring board which is applicable even to circuit boards which operate at high speed, and which can suppress radiation of electromagnetic waves, and which can prevent a decrease in the density of mounting.

In order to achieve the above-described object, a first aspect of the present invention is a printed wiring board in which a signal wire layer having a signal wire wired therein, and a first ground layer and a second ground layer which form ground regions, are laminated via respective insulating layers, the printed wiring board comprising: a plurality of interlayer connecting members electrically connecting the ground region formed by the first ground layer and the ground region formed by the second ground layer; and a power source wire wired at at least one of the first ground layer and the second ground layer.

The printed wiring board is a structure in which a signal wire layer for wiring the signal wire, and a first ground layer and a second ground layer which form ground regions, are laminated via insulating layers, respectively. The ground region of the first ground layer and the ground region of the second ground layer are electrically connected by the plurality of interlayer connecting member so as to be, for example, substantially the same electric potential.

The power source wire is wired, so as to be isolated from and independent of the ground region, at at least one of the first ground layer and the second ground layer. Namely, at least one of the first ground layer and the second ground layer is structured by, for example, a ground region whose surface area is relatively large, and a wire-shaped power source pattern region whose surface area is smaller than that of the ground region and which is isolated from and independent of the ground region.

In this way, the power source wire is provided at at least one of the first ground layer and the second ground layer. Thus, electromagnetic wave radiation due to resonance current at a printed board having a conventional structure in which the power layer and the ground layer oppose one another, can be reduced.

Further, in a case in which, for example, a signal wire layer having a signal wire wired therein, a first ground layer having a power source wire, and a second ground layer are laminated in that order, when signal current flows at the signal wire wired at the signal wire layer, return current flows at the region, of the first ground layer, corresponding to the signal wire, i.e., on a projected line which is projected onto the first ground layer. Namely, the projected line shows the path through which the return current flows.

Here, when the power source wire, which is provided at the first ground layer, and the signal wire are disposed such that the power source wire and the projected line of the signal wire onto the first ground layer cross, the return current flowing on the first ground layer is cut off midway therealong at the position of the power source wire. However, the first ground layer and the second ground layer are connected by the plurality of interlayer connecting members. Thus, the return current can be made to detour to the second ground layer at a low impedance, and therefore, electromagnetic wave radiation can be suppressed.

In this way, because the first ground layer and the second ground layer are connected by the plurality of interlayer connecting members, a path, through which the return current of the current flowing through the signal wire flows, can be formed.

The shorter the path through which the return current flows, the more the electromagnetic wave radiation can be suppressed. Thus, it is preferable that the printed wiring board includes, as the signal wire layer, a first signal wire layer and a second signal wire layer, and the printed wiring board includes, as the power source wire, a first power source wire at the first ground layer and a second power source wire at the second ground layer, and the first signal wire layer is disposed adjacent to the first ground layer via the insulating layer, and the second signal wire layer is disposed adjacent to the second ground layer via the insulating layer. Namely, the first signal wire layer, the first ground layer in which the first power source wire is wired, the second ground layer in which the second power source wire is wired, and the second signal wire layer are laminated via insulating layers. Further, the first signal wire layer is disposed adjacent to the first ground layer via an insulating layer, and the second signal wire layer is disposed adjacent to the second ground layer via an insulating layer.

In this way, by disposing the first signal wire layer adjacent to the first ground layer via an insulating layer and disposing the second signal wire layer adjacent to the second ground layer via an insulating layer, the paths through which the respective return currents thereof flow can be made shorter, and electromagnetic wave radiation can be suppressed even more. Further, because the first power source wire and the second power source wire are wired at respectively different ground layers, they can be freely wired, and wiring in which the second power source wire crosses a projected line of the first power source wire onto the second ground layer is possible.

The interlayer connecting members are provided, for example, at predetermined intervals. For example, a large number of interlayer connecting members are provided at uniform intervals. In this way, the electric potentials of the first ground layer and the second ground layer can be made to approach a same electric potential, and the paths of the return currents can be shortened, and electromagnetic wave radiation can be suppressed more.

It is preferable that, given that a propagation velocity of a standing wave on the ground region is c, a dielectric constant of the insulating layer is $\in r$, and a maximum frequency of electromagnetic wave radiation which is an object is f, the predetermined interval is set to be $c/(2\times f\times \in r^{1/2})$ or less. By disposing the interlayer connecting members at such an interval, electromagnetic wave radiation can be effectively suppressed for various frequencies.

The interlayer connecting members may be further provided along at least one of a peripheral edge portion and an inner edge portion of the ground region.

Namely, when, at the end portion of a ground region, an electric potential difference with respect to another ground region arises, electromagnetic wave radiation is generated from the end portion of the board. Thus, interlayer connecting members are disposed along the peripheral edge portion (i.e., the outer edge) of the ground region, and along the inner peripheral portion (i.e., the peripheral edge portion of an opening portion in a case in which there is an opening portion in the ground region), so as to interlayer-connect the first ground region and the second ground region. In this way, radiation of electromagnetic waves from the end portions of the board can be suppressed.

It is preferable that the ground region exists at a position of a projected line of the power source wire wired at one of the ground layers, which projected line is projected onto another of the ground layers. In accordance with such a structure, when the path of the return current flowing through one ground layer is cut-off midway therealong at the position of the power source wire and the return current is detoured to and flows at the other ground layer, a ground region exists at a position of a projected line of the power source wire, which projected line is projected onto the other ground layer. Thus, the return current does not go about a long way, and flows through the shortest path. Therefore, electromagnetic wave radiation can be suppressed.

The signal wire layer may be provided between the first ground layer and the second ground layer. By providing the signal wire layer between the first ground layer and the second ground layer in this way, the impedance of the signal wire wired at the signal wire layer can be made to be an even lower impedance, and thus, an even higher speed signal can flow at the signal wire. Further, by providing the signal wire between the first ground layer and the second ground layer which are connected by the plurality of interlayer connecting members so as to be substantially the same electric potential, radiation of electromagnetic waves due to the signal wire can be shielded, and radiation of electromagnetic waves to the exterior can be reduced.

The signal wire and the power source wire, which is provided at a signal wire side ground layer, may be disposed such that the power source wire and a projected line of the signal wire onto the ground layer cross, and the plurality of interlayer connecting members may be disposed in vicinities of both sides of the power source wire. In this way, the return current flowing at one ground layer can be made to detour, through a shorter path, to the other ground layer, and the path of the return current can be made shorter. Thus, electromagnetic wave radiation can be reliably suppressed.

The signal wire and the power source wire, which is provided at a signal wire side ground layer, may be disposed such that the power source wire and a projected line of the signal wire onto the ground layer do not cross. In this way, for example, in a case in which the signal wire layer with the signal wire wired therein, the first ground layer having the power source wire, and the second ground layer are laminated in that order, when the signal current flows in the signal wire wired in the signal wire layer, the return current flows on the projected line, at the first ground layer, of the signal wire. By wiring the power source wire and the signal wire such that the power source wire and the projected line of the signal wire do not cross, the path of the return current is not cut midway therealong. Thus, the return current can be made to flow at the position at which the return current should flow, i.e., on the projected line of the signal wire. Therefore, the return current can be made to flow through the shortest path, and radiation of electromagnetic waves can be suppressed.

In this case, a structure is possible in which the signal wire layer is provided at both a first ground layer side and a second ground layer side, and the power source wire is provided at both the first ground layer and the second ground layer, and a first power source wire provided at the first ground layer and a first signal wire formed on the first signal wire layer are disposed such that at least a portion of the first power source wire and at least a portion of a projected line of the first signal wire onto the first ground layer are substantially parallel, and a second power source wire provided at the second ground layer and a second signal wire formed on the second signal wire layer are disposed such that at least a portion of the second power source wire and at least a portion of a projected line of the second signal wire onto the second ground layer are substantially parallel.

As described above, in the first aspect of the present invention, it is possible to even more reliably ensure that the power source wire and the projected line of the signal wire do not cross.

Further, the power source wire may be provided at the first ground layer, and a power source wire, whose supplied voltage is different than that of the power source wire provided at the first ground layer, may be provided at the second ground layer.

In this way, by wiring power source wires, which have respectively different supplied voltages, at the different ground layers, a power source wire can be wired freely at each ground layer, and the degrees of freedom in design can be increased.

When the power source wire is disposed at the end portion of the board, i.e., at the neighbor of the edges of the board, there are cases in which the electromagnetic wave radiation increases. Thus, the power source wire may be disposed at an inner side such that the ground region is disposed between the power source wire and an end portion of the board.

Namely, the power source wire is disposed at the inner side so as to be surrounded by the ground region. In this way, the greater the distance from the board end portion to the power source wire, the more effectively electromagnetic wave radiation can be suppressed.

Further, when noise current, which is caused by an IC or the like disposed on the board, propagates through the power source wire, there are cases in which reflection at the end portion of the power source wire is repeated, and electromagnetic wave radiation due to the one-dimensional resonance arises.

Thus, a second aspect of the present invention is a printed wiring board in which a signal wire layer having a signal wire wired therein, and a first ground layer and a second ground layer which form ground regions, are laminated via respective insulating layers, the printed wiring board comprising: a plurality of interlayer connecting members electrically connecting the ground region formed by the first ground layer and the ground region formed by the second ground layer; a power source wire wired at at least one of the first ground layer and the second ground layer; and a terminal element connected, in a vicinity of a terminal portion of the power source wire, between the power source wire and at least one ground region of the first ground layer and the second ground layer, the terminal element having an impedance which matches a characteristic impedance of the power source wire.

Namely, the terminal element, which has impedance matching the characteristic impedance of the power source wire, is connected, for example, between the power source wire and the ground region of the ground layer opposing the ground layer at which the power source wire is wired, or between the ground region of the ground layer at which the power source wire is wired and the power source wire adjacent to this ground region, or between the power source wire and the ground regions of both ground layers. In this way, radiation of electromagnetic waves due to reflection generated at the end portion of the power source wire can be suppressed. Here, it is preferable that the impedance of the terminal element coincides with and completely matches the characteristic impedance of the power source wire. However, when the effect of suppressing electromagnetic wave radiation is greater than in a case in which there is no terminal element and the impedance does not match, this is called "matching" as well, even if such matching is incomplete.

The terminal element may include a resistor and a capacitor connected in series.

The power source wire may be formed from a main power source wire and a branch power source wire which is branched off from the main power source wire, and the terminal element may be connected to a terminal portion of the main power source wire.

The main power source wire is a main power source wire for, for example, supplying power to the respective parts, and is a power source wire which is longer than the branch power source wire. The main power source wire may be branched into plural main power source wires. The branch power source wire is shorter than the main power source wire, and supplies, to the respective parts, the power supplied by the main power source wire.

In this way, electromagnetic wave radiation due to reflectance generated at the end portion of the main power source wire can be suppressed.

Further, when the branch power source wire is sufficiently shorter than the main power source wire, electromagnetic wave radiation due to reflection generated at the end portion of the branch power source wire is not a problem. However, if the branch power source wire is long, it is preferable that the terminal element is connected to a terminal portion of the branch power source wire. In this way, electromagnetic wave radiation can be suppressed effectively.

The signal wire layer may be formed at the same layer as at least one of the first ground layer and the second ground layer. Namely, the signal wire layer, and at least one of the first ground layer and the second ground layer, may be commonly used at the same layer. The signal wire is wired at at least one of the first ground layer and the second ground layer. The present invention described above can be applied even to the case of such a two-layer board.

It is preferable that the power source wire is formed from a main power source wire and a plurality of branch power source wires which are branched off from the main power source wire, and a width of the power source wire is set on the basis of respective predetermined maximum current values of devices which are connected to the branch power source wires respectively and which are operated by power supplied from the main power source wire.

The width of the power source wire is set such as follows for example. The current value which flows into a node, which is a point of intersection between the main power source wire and a branch power source wire, is determined for each node from the maximum current value of the device connected to that branch power source wire, i.e., from the maximum current value needed by that device. Then, the width of the power source wire is determined such that, when current of the maximum current value among the determined current values flows through the power source wire, the rise in the temperature of the power source wire is a predetermined value or lower, and the electric potential differences between the respective nodes are predetermined values or less.

Specifically, the width of the power source wire is set by determining a width which corresponds to the maximum current value among the determined current values, from predetermined corresponding relationships between, for example, widths of power source wires and current values which can flow through power source wires of those widths.

In this way, by setting the width of the power source wire to a width which corresponds to the maximum current value of the currents flowing into the respective nodes, power can be supplied stably to the respective devices, and electromagnetic wave radiation can be effectively suppressed.

Moreover, it is preferable that the power source wire is formed from a main power source wire and a plurality of branch power source wires which are branched off from the main power source wire, and a predetermined first length of a first branch power source wire, and a second length, which is from an end portion of a second branch power wire to which is connected a device which is operated by power supplied from the main power source wire, to an end portion of the first branch power source wire, are set such that the second length is a dimension other than a length equal to the first length times an odd number m divided by an odd number n (where m=3, 5, 7; n=1, 3, 5; m>n).

For example, the first length and the second length are set such that the first length is not n times a wavelength which is a predetermined multiple of the wavelength of the electromagnetic wave radiation frequency which is the object, and the second length is not m times said wavelength which is the predetermined multiple. Namely, given that the first length is L1 and the second length is L2, L1 and L2 are set such that the relation $L2=(m/n)\times L1$ is not established. By setting the first length and the second length such that this relationship is satisfied, electromagnetic wave radiation can be effectively suppressed.

Further, if a capacitance exists on the power source wire, the first length and the second length may be set in accordance with the above-described conditions, by adding a length corresponding to the capacitance to at least one of the first length and the second length in accordance with the power source wire at which the capacitance exists.

DETAILED DESCRIPTION OF THE PREFERRED EMBODIMENTS

[First Embodiment]

A first embodiment of the present invention will be described hereinafter.

Figures 1A, 1B:
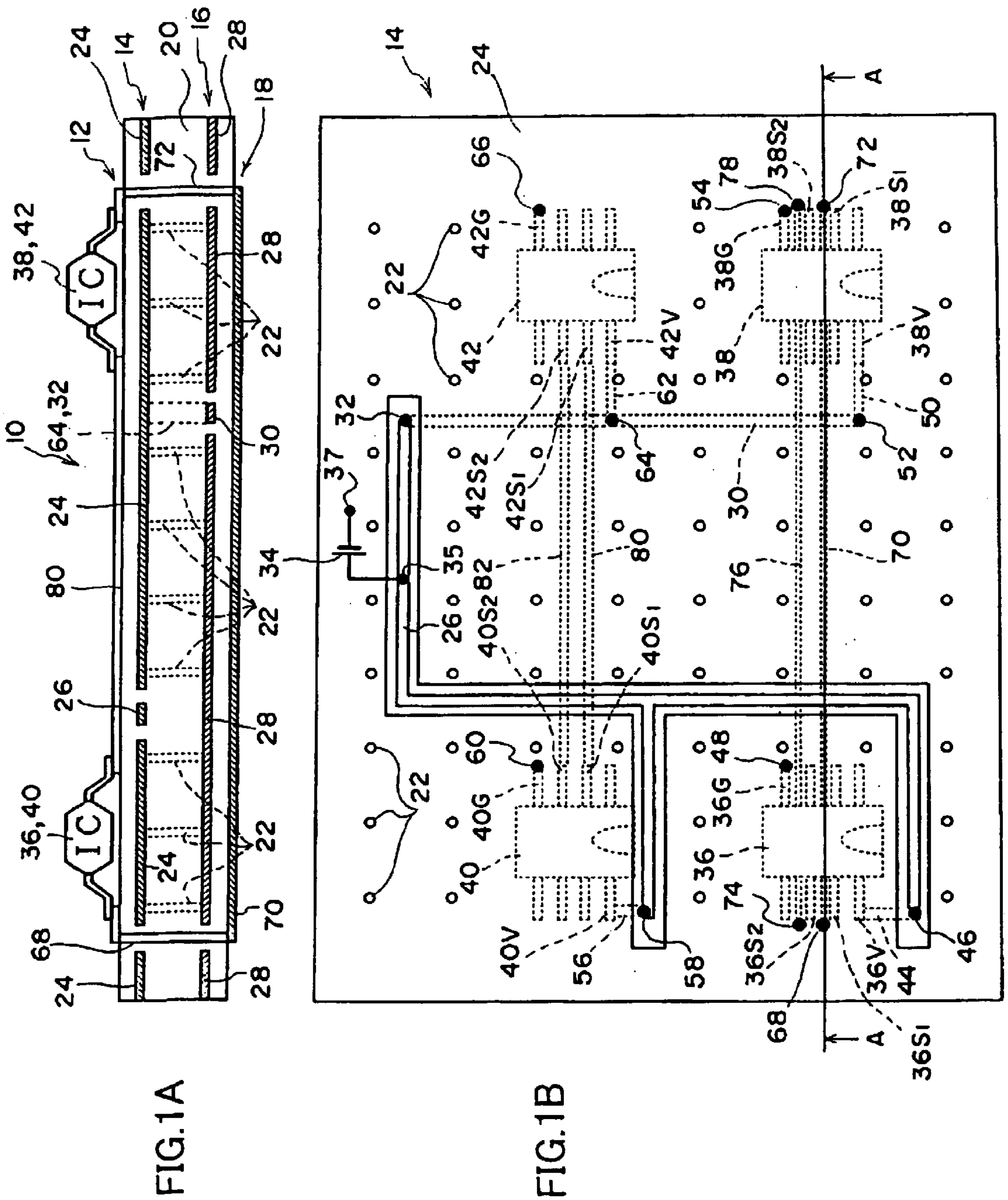
FIG. 1A is a sectional view, taken along line A—A, of a printed wiring board relating to a first embodiment and shown in FIG. 1B.
FIG. 1B is a schematic plan view of FIG. 1A.

FIG. 1A is a schematic sectional view of a printed wiring board 10 relating to the present embodiment. As shown in FIG. 1A, the printed wiring board 10 is a four-layer board having a multilayer structure in which a first signal wire layer 12, a first ground layer 14, a second ground layer 16, and a second signal wire layer 18 are laminated via an insulating material 20.

FIG. 1B is a plan view of the first ground layer 14. Note that FIG. 1A is a sectional view, taken along line A—A, of FIG. 1B.

As shown in FIGS. 1A and 1B, the first ground layer 14 and the second ground layer 16 are interlayer-connected by a large number of via holes 22. As shown in FIG. 1B, these via holes 22 are disposed at substantially uniform intervals over the entire surface including the first ground layer 14. In this way, by connecting the first ground layer 14 and the second ground layer 16 by the many via holes 22, the first and second ground layers 14 and 16 become substantially the same electric potential.

Moreover, as shown in FIGS. 1A and 1B, a ground pattern 24 and a wire-shaped first power source wire 26 are formed so as to be isolated and independent at the first ground layer 14. A ground pattern 28 and a wire-shaped second power source wire 30 are formed so as to be isolated and independent at the second ground layer 16.

The power source wire 26 is formed at the inner side, such that the ground pattern 24 is disposed between the power source wire 26 and the end portions of the board. The power source wire 30 is formed at the inner side, such that the ground pattern 28 is disposed between the power source wire 30 and the end portions of the board.

The first power source wire 26 and the second power source wire 30 are interlayer-connected by a via hole 32. For example, the plus terminal of a DC voltage power source 34, which is mounted on the first signal wire layer 12, is connected to the first power source wire 26 via a via hole 35. The minus terminal of the DC voltage power source 34 is connected to the ground pattern 24 via a via hole 37. In this way, a predetermined DC voltage Vcc is applied to the first power source wire 26 and the second power source wire 30 from the DC voltage power source 34.

Further, ICs (e.g., digital ICs) 36, 38, 40, 42, whose operating frequencies and signal frequencies are high frequencies (e.g., several MHz to several GHz), are mounted to the first signal wire layer 12. A power source terminal 36V of the IC 36 is connected to the first power source wire 26 via a connecting pattern 44 and a via hole 46. A ground terminal 36G of the IC 36 is connected to the first ground layer 14 via a via hole 48. In this way, the DC voltage Vcc is supplied from the first power source wire 26 to the power source terminal 36V, and the IC 36 can be operated.

A power source terminal 38V of the IC 38 is connected to the second power source wire 30 via a connecting pattern 50 and a via hole 52. A ground terminal 38G of the IC 38 is connected to the first ground layer 14 via a via hole 54. In this way, the DC voltage Vcc is supplied from the second power source wire 30 to the power source terminal 38V, and the IC 38 can be operated.

A power source terminal 40V of the IC 40 is connected to the first power source wire 26 via a connecting pattern 56 and a via hole 58. A ground terminal 40G of the IC 40 is connected to the first ground layer 14 via a via hole 60. In this way, the DC voltage Vcc is supplied from the first power source wire 26 to the power source terminal 40V, and the IC 40 can be operated.

A power source terminal 42V of the IC 42 is connected to the second power source wire 30 via a connecting pattern 62 and a via hole 64. A ground terminal 42G of the IC 42 is connected to the first ground layer 14 via a via hole 66. In this way, the DC voltage vcc is supplied from the second power source wire 30 to the power source terminal 42V, and the IC 42 can be operated.

A signal terminal 36$S_1$ of the IC 36 is connected, via a through hole 68, to one end of a wire-shaped signal wire 70 formed at the second signal wire layer 18. The other end of the signal wire 70 is connected to a signal terminal 38$S_1$ of the IC 38 via a through hole 72.

A signal terminal 36$S_2$ of the IC 36 is connected, via a through hole 74, to one end of a wire-shaped signal wire 76 formed at the second signal wire layer 18. The other end of the signal wire 76 is connected to a signal terminal 38$S_2$ of the IC 38 via a through hole 78. In this way, transmission and receipt of signals between the IC 36 and the IC 38 are possible.

A signal terminal 40$S_1$ of the IC 40 is connected to a signal terminal 42$S_1$ of the IC 42 by a signal wire 80. A signal terminal 40$S_2$ of the IC 40 is connected to a signal terminal 42$S_2$ of the IC 42 by a signal wire 82. In this way, transmission and receipt of signals between the IC 40 and the IC 42 are possible.

As shown in FIG. 1B, the signal wires 80, 82, and the first power source wire 26 cross one another (cross one another at a right angle). Further, the signal wires 70, 76 and the second power source wire 30 cross one another (cross one another at a right angle).

In this way, at the printed wiring board 10, the first power source wire 26 is formed at the first ground layer 14 and the second power source wire 30 is formed at the second ground layer 16, without there being a power layer which opposes the first ground layer 14 and the second ground layer 16. Thus, no electromagnetic wave radiation is generated due to resonance between the power layer and the ground layers, and the power source wires are provided at inner layers. Thus, the density of mounting of the signal wire layers can be increased.

Next, description will be given of the path through which return current flows when a signal is outputted, i.e., when signal current flows, from the signal terminal 36$S_1$ of the IC 36 to the signal wire 38$S_1$ of the IC 38.

Figure 2:
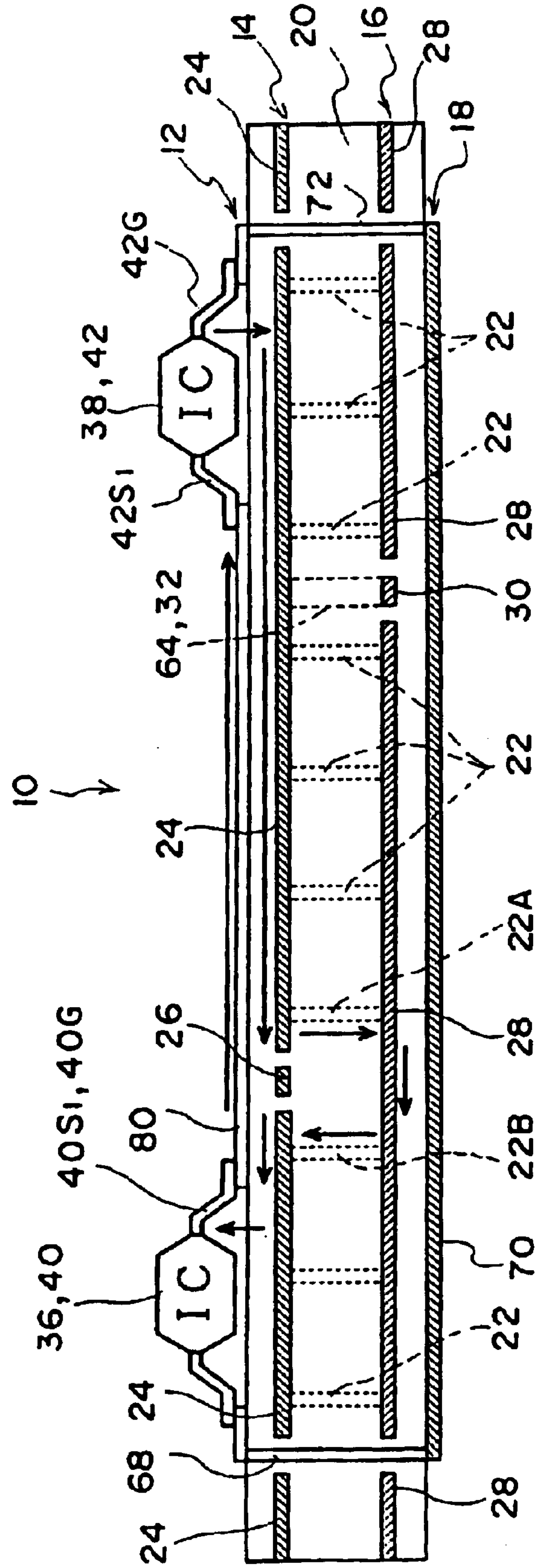
FIG. 2 is a schematic sectional view of the printed wiring board relating to the first embodiment.

In FIG. 2, the path of the return current, at the time when signal current flows from the signal terminal 40$S_1$ of the IC 40 to the signal wire 42$S_1$ of the IC 42, is shown by the arrows. As shown in FIG. 2, the signal current flows in the order of the signal terminal 40$S_1$ of the IC 40, the signal wire 80, the signal terminal 42$S_1$ of the IC 42, the IC 42 main body, the ground terminal 42G of the IC 42, and (the ground pattern 24 of) the first ground layer 14. Then, at the first ground layer 14, the return current flows to a position at which the signal wire 80 is projected in a direction orthogonal to the surface of the drawing of FIG. 1B. Namely, the return current flows to a position, corresponding to the signal wire 80, of the first ground layer 14 which is positioned directly beneath the signal wire 80.

As shown in FIG. 2, the path of the return current flowing at the first ground layer 14 is cut midway therealong at the position of the first power source wire 26. However, in the present embodiment, because a large number of the via holes 22 are provided at substantially uniform intervals, the return current flows to the second ground layer 16 (the ground pattern 28) via a via hole 22A provided in a vicinity of the first power source wire 26, and flows to the first ground layer 14 via a via hole 22B provided in a vicinity of the first power source wire 26, and flows to the ground terminal 40G of the IC 40 via the via hole 60.

Figure 3:
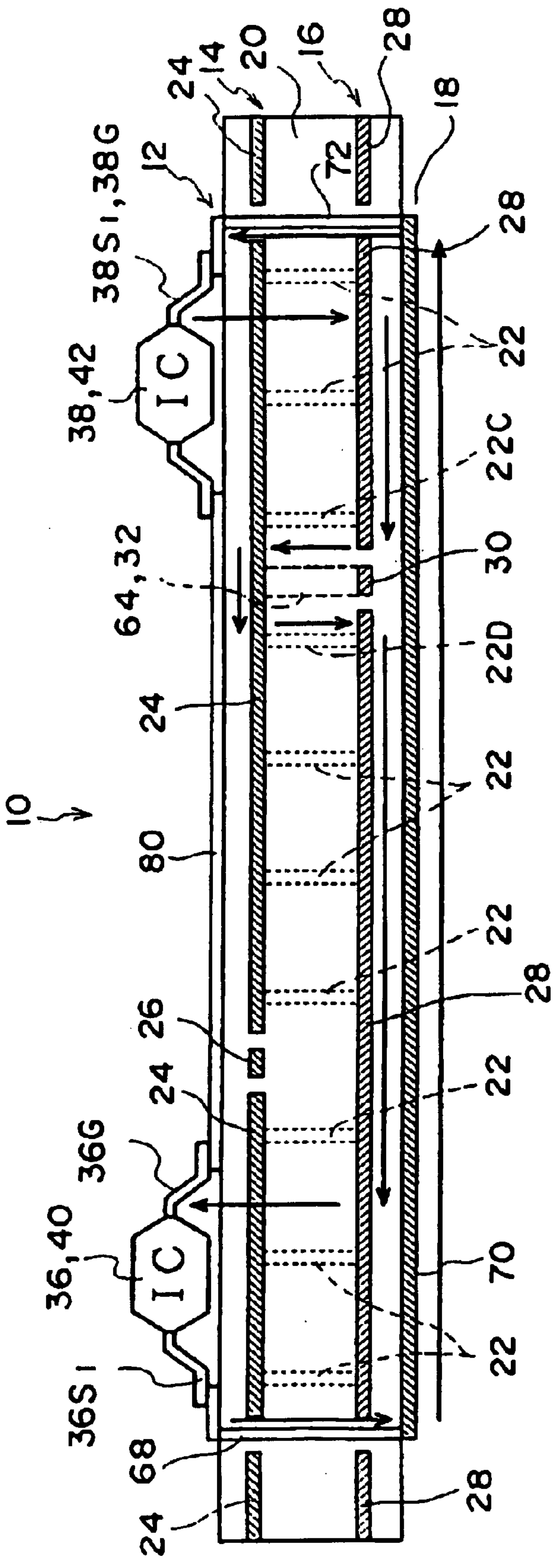
FIG. 3 is a schematic sectional view of the printed wiring board relating to the first embodiment.

In FIG. 3, the path of the return current, at the time when signal current flows from the signal terminal 36$S_1$ of the IC 36 to the signal wire 38$S_1$ of the IC 38, is shown by the arrows. As shown in FIG. 3, the signal current flows in the order of the signal terminal 36$S_1$ of the IC 36, the through hole 68, the signal wire 70, the through hole 72, the signal terminal 38$S_1$ of the IC 38, the IC 38 main body, the ground terminal 38G of the IC 38, (the ground pattern 24 of) the first ground layer 14, and (the ground pattern 28 of) the second ground layer 16. Then, at the second ground layer 16, the return current flows to a position at which the signal wire 70 is projected in a direction orthogonal to the surface of the drawing of FIG. 1B. Namely, the return current flows to a position, corresponding to the signal wire 70, of the second ground layer 16 which is positioned directly above the signal wire 70.

As shown in FIG. 3, the path of the return current flowing at the second ground layer 16 is cut midway therealong at the position of the second power source wire 30. However, in the present embodiment, because a large number of the via holes 22 are provided at substantially uniform intervals, the return current flows to (the ground pattern 24 of) the first ground layer 14 via a via hole 22C provided in a vicinity of the second power source wire 30, and flows to the second ground layer 16 via a via hole 22D provided in a vicinity of the second power source wire 30, flows to the first ground layer 14 via the via holes 22 provided in a vicinity of the ground terminal 36G of the IC 36, and flows to the ground terminal 36G of the IC 36 via the via hole 48.

In this way, in the present embodiment, because a large number of the via holes 22 are provided at substantially uniform intervals, the first ground layer 14 and the second ground layer 16 can be made to be substantially the same electric potential. Even when the path of the return current is cut by the power source wire, the return current can be made to detour at a low impedance and on a relatively short path.

Further, the ground pattern 28 exists at a position of a projected line, of the first power source wire 26, projecting onto the second ground layer 16. Thus, the path of the return current is not cut midway therealong at the position of the projected line of the first power source wire 26, and the return current can flow through the shortest path without being made to take a long way around.

In this way, the path of the return current can be prevented from becoming long, and the electromagnetic wave radiation can be kept to a minimum.

Figure 11:
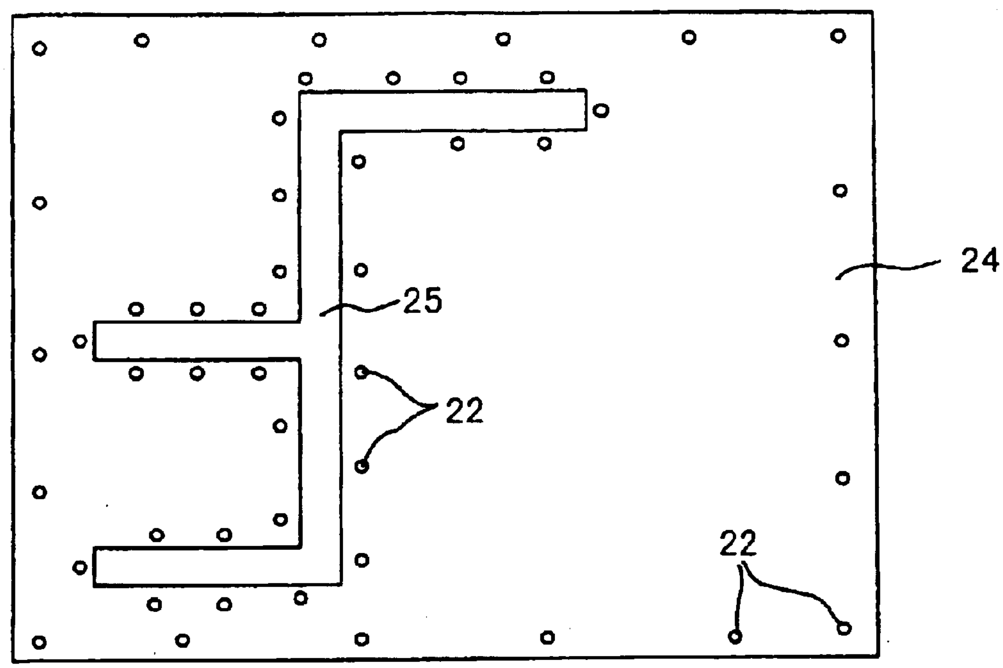
FIG. 11 is a schematic plan view of the first ground layer of the printed wiring board relating to the present invention.

A large number of via holes 22 are provided at predetermined intervals across the entire ground pattern. As shown in FIG. 11, the via holes 22 are further provided at predetermined intervals along the peripheral portion of the ground pattern 24 of the first ground layer 14, and along the peripheral portion of an opening portion 25 provided at the position at which the first power source wire 26 is wired. Further, although not illustrated, the via holes 22 may be further provided at predetermined intervals along the peripheral portion of an opening portion provided at a position, of the second ground layer 16, where the second power source wire 30 is wired. In this way, radiation of electromagnetic waves from the end portions of the board can be suppressed.

The interval at which the via holes 22 are disposed is determined, for example, as follows from the relationship with the frequency of a standing wave which causes electromagnetic wave radiation.

For example, the region between two via holes 22 can be considered to be a transmission path where the impedance which short-circuits both is substantially zero. The standing wave of the minimum frequency which can be generated at this transmission path is a standing wave whose half-wave length is the distance of the transmission path, i.e., the interval of the via holes 22. The propagation velocity c of the standing wave on a general printed wiring board (having a dielectric constant $\in r$ of, for example, about 4.7) is around 140 mm/ns. Thus, for example, when electromagnetic wave radiation due to a standing wave including a higher harmonic wave of up to a maximum of 1 GHz (period 1 ns) is problematic, the electromagnetic wave radiation can be suppressed by making the interval at which the via holes 22 are provided to be around 70 mm or less. Namely, the radiation of electromagnetic waves can be suppressed by making a maximum placement interval W of the via holes 22 to be less than or equal to a distance which satisfies $W=c/(2\times f\times \in r^{1/2})$ for the maximum frequency f which is problematic. Here, c is light velocity, and $\in r$ is the dielectric constant of the printed wiring board.

Due to the structure of the printed wiring board 10 relating to the present embodiment, the following effects are also achieved.

Generally, in order to drive a large load (an IC or the like) at high speed, the characteristic impedance of the wires must be small. In a conventional board having a four-layer structure in which the power layer and the ground layer are disposed so as to oppose one another at the inner layers, the characteristic impedance when the signal wires are microstrip wires increases the greater the distance between the signal wire layer and the power layer or the ground layer adjacent to the signal wire layer. Namely, smaller intervals between the power layer or the ground layer and the signal wire layer at the front surface or the reverse surface of the printed wiring board, are advantageous for high speed driving. Further, the electromagnetic wave noise, which is radiated from the end portions of a conventional multilayer board such as a four-layer board or the like, increases in proportion to the distance between the power layer and the ground layer. Moreover, in order to ensure the strength of the printed wiring board for withstanding the mounting of parts, the thickness of the board cannot be made excessively small.

Namely, in a conventional board having a multilayer structure, when the interval between the signal wire layer and the power layer or the ground layer is made small in order to carry out high speed driving, the interval between the power layer and the ground layer must be made large in order for the board to not be thin. Thus, electromagnetic wave noise cannot be suppressed. Conversely, when the interval between the power layer and the ground layer is made small in order to suppress the electromagnetic wave noise, the interval between the signal wire layer and the power layer or the ground layer must be made large in order for the board to not be thin. Thus, high speed driving is not possible. In this way, in a conventional multilayer board, there is a trade-off between high-speed driving and the suppression of electromagnetic wave radiation caused by the power layer and the ground layer.

In contrast, in the printed wiring board relating to the present embodiment, even if the interval between the two ground layers disposed at the inner layers is made large, the electromagnetic wave radiation does not increase. Thus, at both the front surface side and the reverse surface side, the interval between the signal wire layer and the ground layer can be made small. In this way, it is possible to achieve both high-speed driving and a suppression of electromagnetic wave radiation, without the thickness of the board becoming excessively small.

In the present embodiment, explanation is given of the printed wiring board in which the first signal wire layer 12, the first ground layer 14, the second ground layer 16, and the second signal wire layer 18 are laminated in that order.

However, the present invention is not limited to the same. Another third layer, e.g., a signal wire layer, may be disposed between the first signal wire layer 12 and the first ground layer 14. In this case, for example, the wires of the third layer must be disposed at a path at which the return current, for the signal current flowing through the signal wire wired at the first signal wire layer 12, cannot flow.

For example, a case in which the entire third layer is a conductor is not preferable because the return current will flow through the third layer. However, if the wires of the third layer are not wired at a position corresponding to the signal wire wired at the first signal wire layer 12, the return current flows to the first ground layer 14 without flowing through the third layer, and there is no effect. Namely, it suffices that the first signal wire layer 12 and the first ground layer are substantially adjacent to one another. Note that the same holds for the relationship between the second signal wire layer 18 and the second ground layer 14 as well.

Next, the effect obtained by the present invention of reducing the number of parts, which effect is due to structuring the power source by wires and structuring the ground layer by two layers as in the present invention, will be described.

Figure 12A:
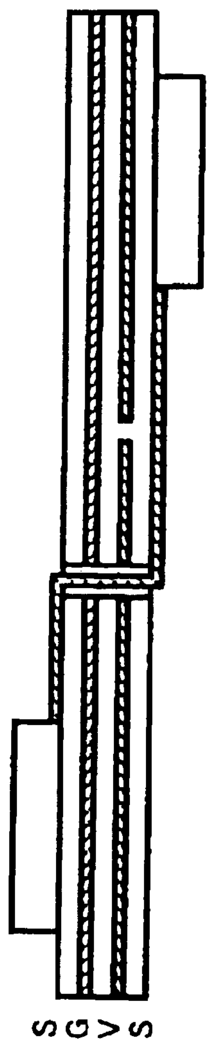
FIG. 12A is a sectional view of a printed wiring board in the conventional art.
Figure 12B:
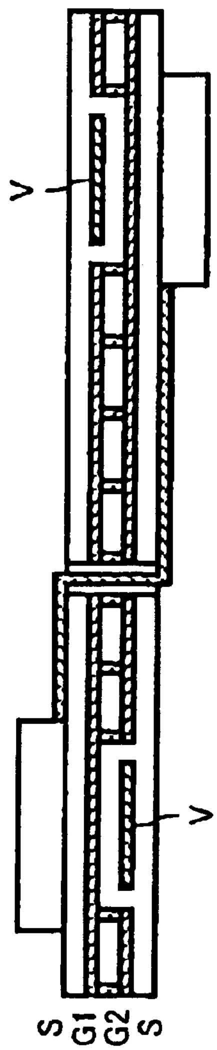
FIG. 12B is a sectional view of the printed wiring board relating to the present invention.

FIG. 12A is a sectional view of a board having a conventional structure in which a signal layer S, a ground layer G, a power layer V, and a signal layer S are laminated. FIG. 12B is a sectional view of the board in accordance with the present invention in which the signal layer S, a first ground layer G1, a second ground layer G2, and the signal layer S are laminated, and power source wires V are wired at the first ground layer G1 and the second ground layer G2.

Figure 13B:
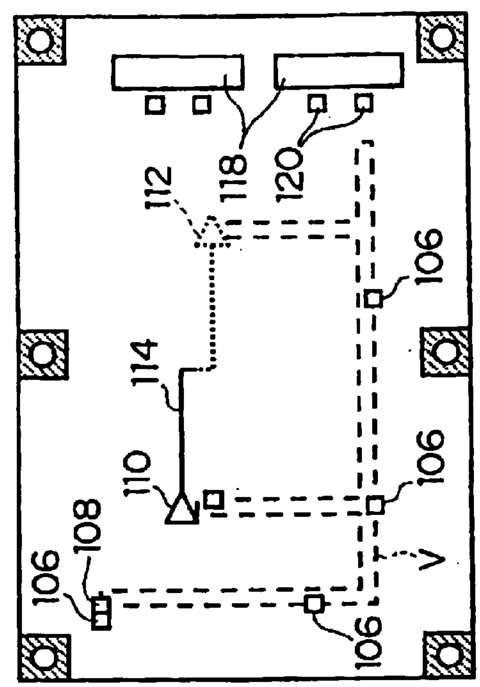
FIG. 13B is a plan view of the printed wiring board relating to the present invention.
Figure 13A:
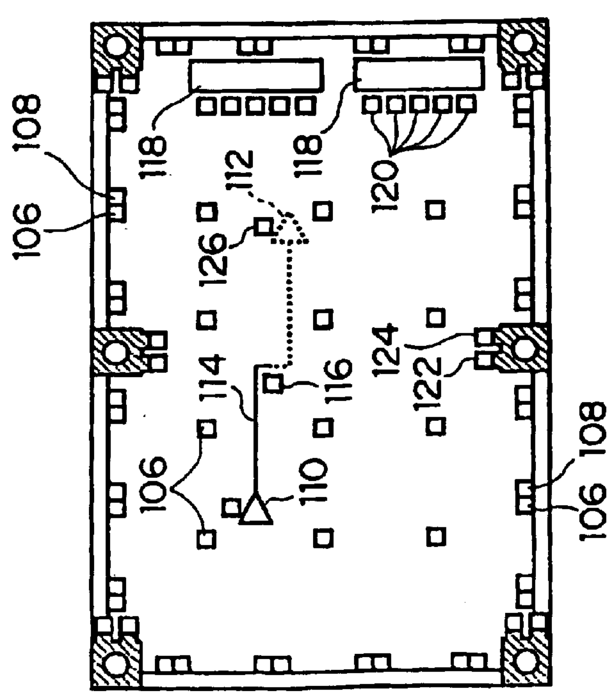
FIG. 13A is a plan view of the printed wiring board in the conventional art.

In the board having the conventional structure shown in FIG. 12A, the power layer V and the ground layer G are disposed so as to oppose one another. Thus, as shown in FIG. 13A, in order to suppress electromagnetic wave radiation due to resonance, many series circuits of capacitors 106 and resistors 108 must be provided at the peripheral portions of the board, and the many capacitors 106 must be provided at predetermined intervals over the entire surface of the board. Moreover, when a driving source 110 such as an IC or the like disposed at one of the signal layers and a driving source 112 disposed at the other signal layer are connected by a signal wire 114, a capacitor 116 for ensuring the path of the return current must be provided. In addition, capacitors 120, which are for cutting-off electromagnetic noise to connectors 118 for connection with another board or the like, must be provided in vicinities of the connectors 118. Further, in order to stabilize the electric potential on the ground surface, a series circuit of a resistor 124 and a capacitor 122 for preventing diffusion of electromagnetic wave noise must be provided between the signal ground and the frame ground. Moreover, it is necessary to provide an inductance 126 for preventing diffusion of electromagnetic wave noise caused by the power source of the driving source 112 such as an IC or the like.

In contrast, in the board having the structure relating to the present invention shown in FIG. 12B, the power source wires are wired at the ground layers, and the two ground layers are connected at many points by the via holes. Thus, radiation of electromagnetic waves is effectively suppressed, and the path of the return current is ensured. Thus, as shown in FIG. 13B, the capacitors, resistors, inductance and the like for suppressing electromagnetic wave noise, which are necessary in the board of the conventional structure, can be greatly eliminated.

[Second Embodiment]

A second embodiment of the present invention will now be described. Portions which are the same as those of the first embodiment are denoted by the same reference numerals, and detailed description thereof is omitted.

Figure 4A:
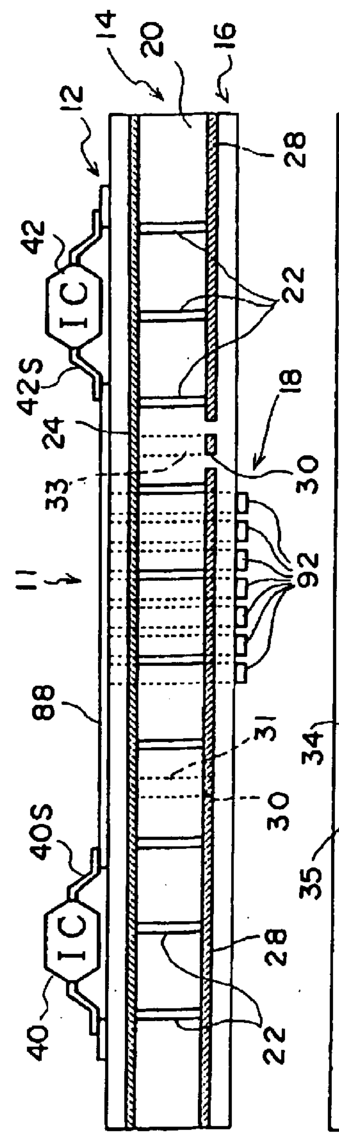
FIG. 4A is a sectional view, taken along line A—A, of a printed wiring board relating to a second embodiment and shown in FIG. 4B.
Figure 4B:
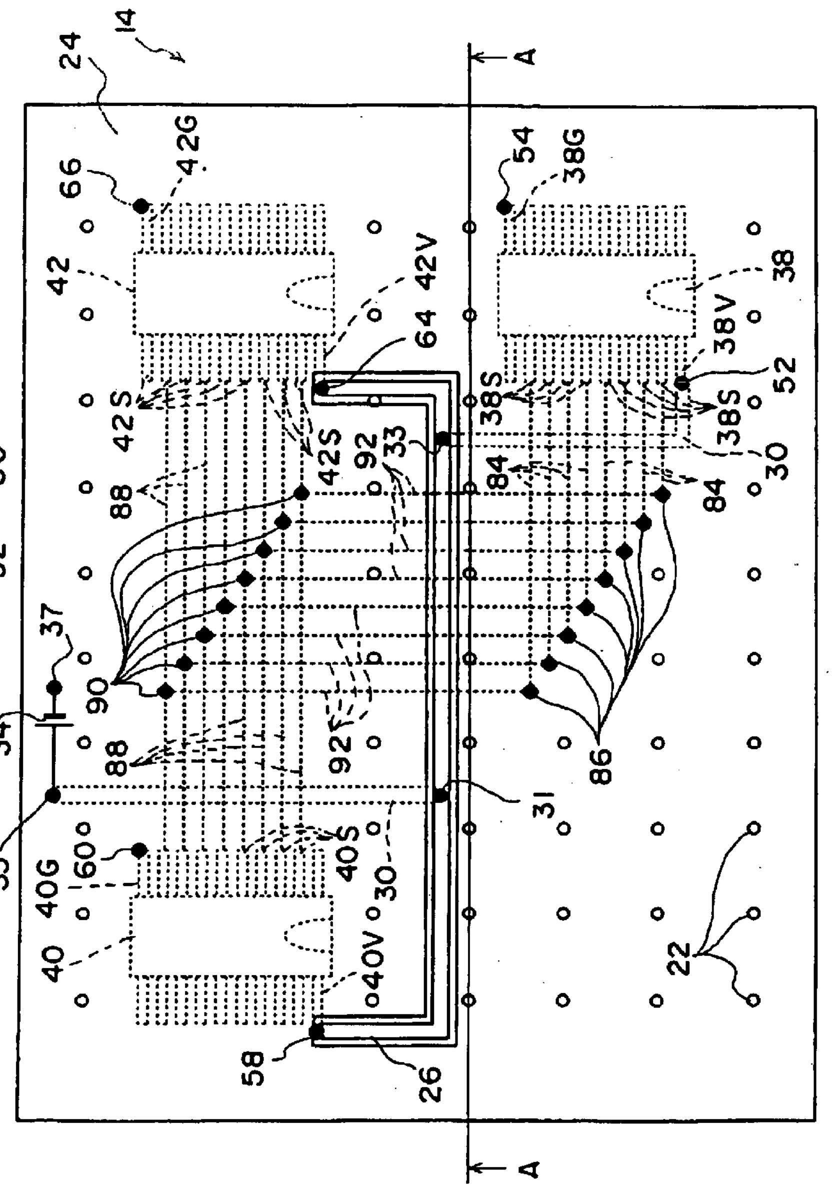
FIG. 4B is a schematic plan view of FIG. 4A.

FIG. 4A is a schematic sectional view of a printed wiring board 11 relating to the present embodiment. FIG. 4B is a plan view of the first ground layer 14. Note that FIG. 4A is a sectional view, taken along line A—A, of FIG. 4B.

As shown in FIGS. 4A and 4B, the first power source wire 26 is wired at the first ground layer 14 of the printed wiring board 11, and the second power source wire 30 is wired at the second ground layer 16. The first power source wire 26 and the second power source wire 30 are interlayer-connected by via holes 31, 33.

For example, the plus terminal of the DC voltage power source 34, which is mounted on the first signal wire layer 12, is connected to the second power source wire 30 via the via hole 35. The minus terminal of the DC voltage power source 34 is connected to the ground pattern 24 via the via hole 37. In this way, the predetermined DC voltage Vcc is applied to the first power source wire 26 and the second power source wire 30 from the DC voltage power source 34.

The power source terminal 38V of the IC 38 is connected to the second power source wire 30 via the via hole 52. The ground terminal 38G of the IC 38 is connected to the first ground layer 14 via the via hole 54. In this way, the DC voltage Vcc is supplied from the second power source wire 30 to the power source terminal 38V, and the IC 38 can be operated.

The power source terminal 40V of the IC 40 is connected to the first power source wire 26 via the via hole 58. The ground terminal 40G of the IC 40 is connected to the first ground layer 14 via the via hole 60. In this way, the DC voltage Vcc is supplied from the second power source wire 30 to the power source terminal 40V, and the IC 40 can be operated.

The power source terminal 42V of the IC 42 is connected to the first power source wire 26 via the via hole 64. The ground terminal 42G of the IC 42 is connected to the first ground layer 14 via the via hole 66. In this way, the DC voltage Vcc is supplied from the second power source wire 30 to the power source terminal 42V, and the IC 42 can be operated.

Plural signal terminals 38S of the IC 38 (in FIG. 4B, eight signal terminals 38S are provided) are connected to respective ones of ends of plural signal wires 84 forming high-speed buses. The other ends of the plural signal wires 84 are connected to respective ones of ends of plural through holes 86 which are for interlayer-connecting the first signal wire layer 12 and the second signal wire layer 18.

Plural signal terminals 40S of the IC 40 and plural signal terminals 42S of the IC 42 are connected respectively by plural signal wires 88 forming the high-speed buses. Ones of ends of plural through holes 90, which are for interlayer-connecting the first signal wire layer 12 and the second signal wire layer 18, are connected to the signal wires 88.

The other ends of the through holes 90 are connected respectively to ones of ends of plural signal wires 92 forming high-speed buses formed at the second signal wire layer 18. The other ends of the signal wires 92 are connected respectively to the other ends of the through holes 86. In this way, the signal terminals of the ICs 38, 40, 42 are connected together by the high-speed buses, and receipt and transmission of signals thereamong is possible.

Moreover, as shown in FIG. 4B, the signal wires 88 wired on the first signal wire layer 12, and the main portions of the first power source wire 26 which is wired at the first ground layer 14 disposed at the first signal wire layer 12 side, are wired substantially parallel. Further, the signal wires 92 wired on the second signal wire layer 18, and the main portions of the second power source wire 30 which is wired at the second ground layer 16 disposed at the second signal wire layer 18 side, are wired substantially parallel.

Namely, the signal wires 88 and the first power source wire 26 are disposed so as to not cross one another, and the signal wires 92 and the second power source wire 30 are disposed so as to not cross one another. In this way, the path of the return current on the first ground layer 14, which corresponds to the signal current flowing through the signal wires 88, is not cut midway therealong. Further, the path of the return current on the second ground layer 16, which corresponds to the signal current flowing through the signal wires 92, is not cut midway therealong. Thus, the path through which the return current flows can be made to be the shortest, and radiation of electromagnetic waves can be suppressed even more.

Figure 7:
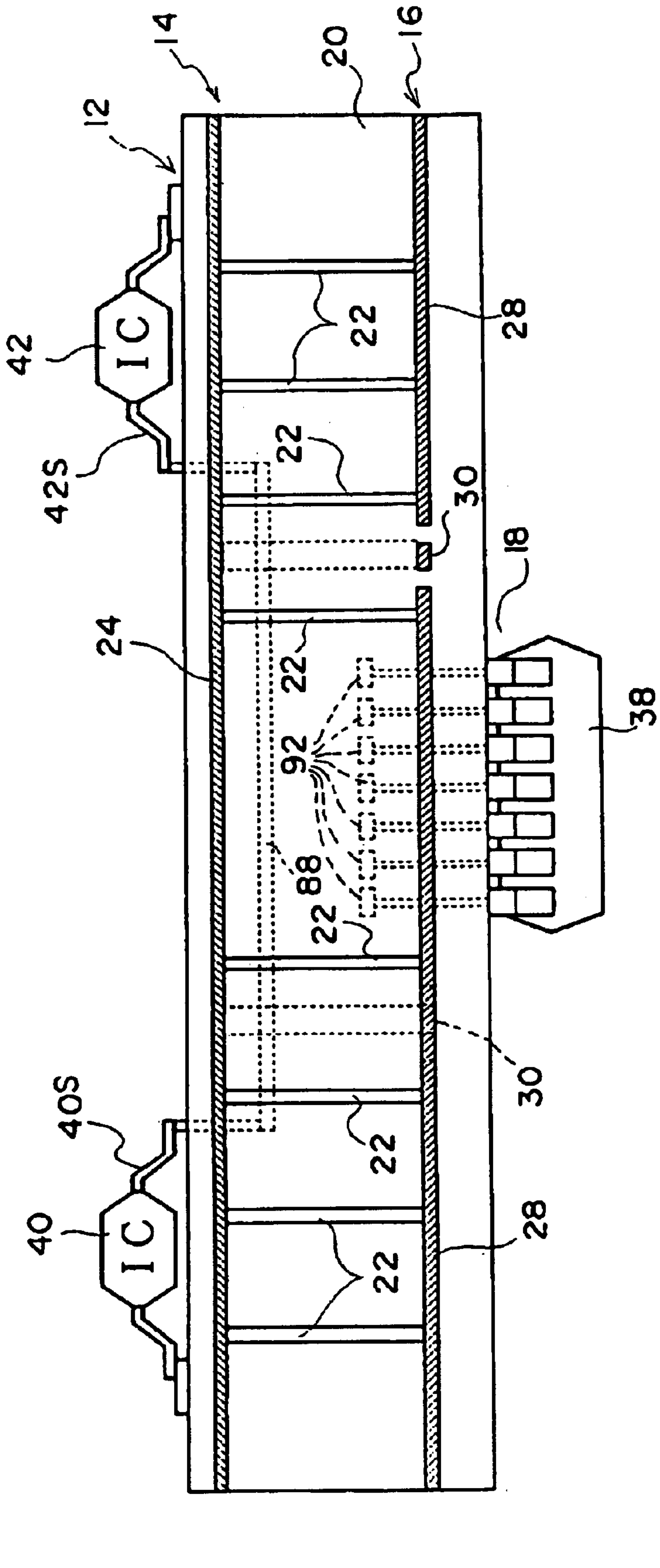
FIG. 7 is a schematic sectional view showing a modified example of the printed wiring board relating to the first embodiment.

Note that, as shown in FIG. 7, the IC 38 may be mounted to the second signal wire layer 18, and the signal wires 88 and the signal wires 92 may be provided between the first ground layer 14 and the second ground layer 16. In this way, by providing the signal wires at the inner layers, the signal wires can be made to be lower impedance than in a case in which the signal wires are provided on the surface of the board. Moreover, because the signal wires are disposed between the two ground layers, the electromagnetic wave radiation is shielded by the signal wires, and therefore, radiation of electromagnetic waves can be suppressed even more.

[Third Embodiment]

A third embodiment of the present invention will now be described. Portions which are the same as those of the above-described embodiments are denoted by the same reference numerals, and detailed description thereof is omitted.

Figure 5:
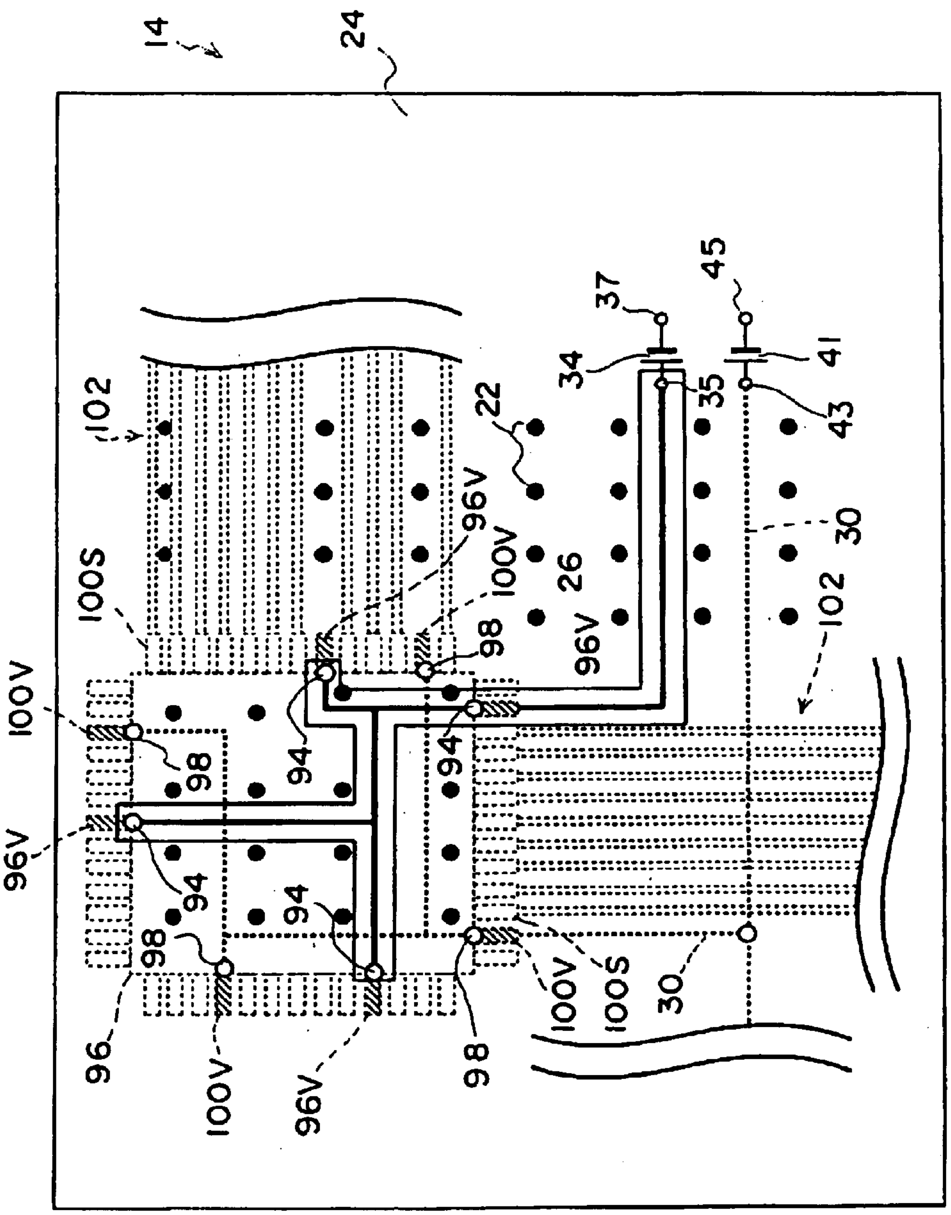
FIG. 5 is a schematic plan view of a first ground layer of a printed wiring board relating to a third embodiment.

FIG. 5 is a schematic plan view of the first ground layer 14 at the printed wiring board relating to the present embodiment.

As shown in FIG. 5, at the first ground layer 14, the ground pattern 24 and the first power source wire 26 are formed to be isolated and independent. At the second ground layer 16, the ground pattern 28 and the second power source wire 30 are formed so as to be isolated and independent.

For example, the plus terminal of the DC voltage power source 34 mounted on the first signal wire layer 12 is connected via the via hole 35 to the first power source wire 26. The minus terminal of the DC voltage power source 34 is connected to the ground pattern 24 via the via hole 37. In this way, a predetermined DC voltage Vcc1 (e.g., 5 V) is applied to the first power source wire 26 from the DC voltage power source 34. Further, the first power source wire 26 is connected, via via holes 94, to power source terminals 96V of an IC 96 mounted on the first signal wire layer 12.

For example, the plus terminal of a DC voltage power source 41, which is mounted on the first signal wire layer 12 and which supplies voltage which is different than the voltage supplied by the DC voltage power source 34, is connected via a via hole 43 to the second power source wire 30. The minus terminal of the DC voltage power source 41 is connected to the ground pattern 24 via a via hole 45. In this way, a DC voltage Vcc2 (e.g., 3.3 V), which is different from the DC voltage Vcc1 supplied to the first power source wire 26 from the DC voltage power source 34, is applied to the second power source wire 30. Further, the second power source wire 30 is connected, via via holes 98, to power source terminals 100V of the IC 96. Moreover, plural signal wires 102 are connected to plural signal terminals 100S of the IC 96, respectively.

In this way, power source wires, whose supplied voltages are different, are wired at different ground layers. As a result, the first power source wire 26 and the second power source wire 30, which have different supplied voltages, can be made to cross one another, as shown in FIG. 5 for example, in the region where the IC 96 is mounted. Thus, the degrees of freedom of wiring the power source wires can be increased.

[Fourth Embodiment]

A fourth embodiment of the present invention will now be described. The present embodiment is a modified example of the first embodiment. Portions which are the same as those of the first embodiment are denoted by the same reference numerals, and detailed description thereof is omitted.

Figure 6:
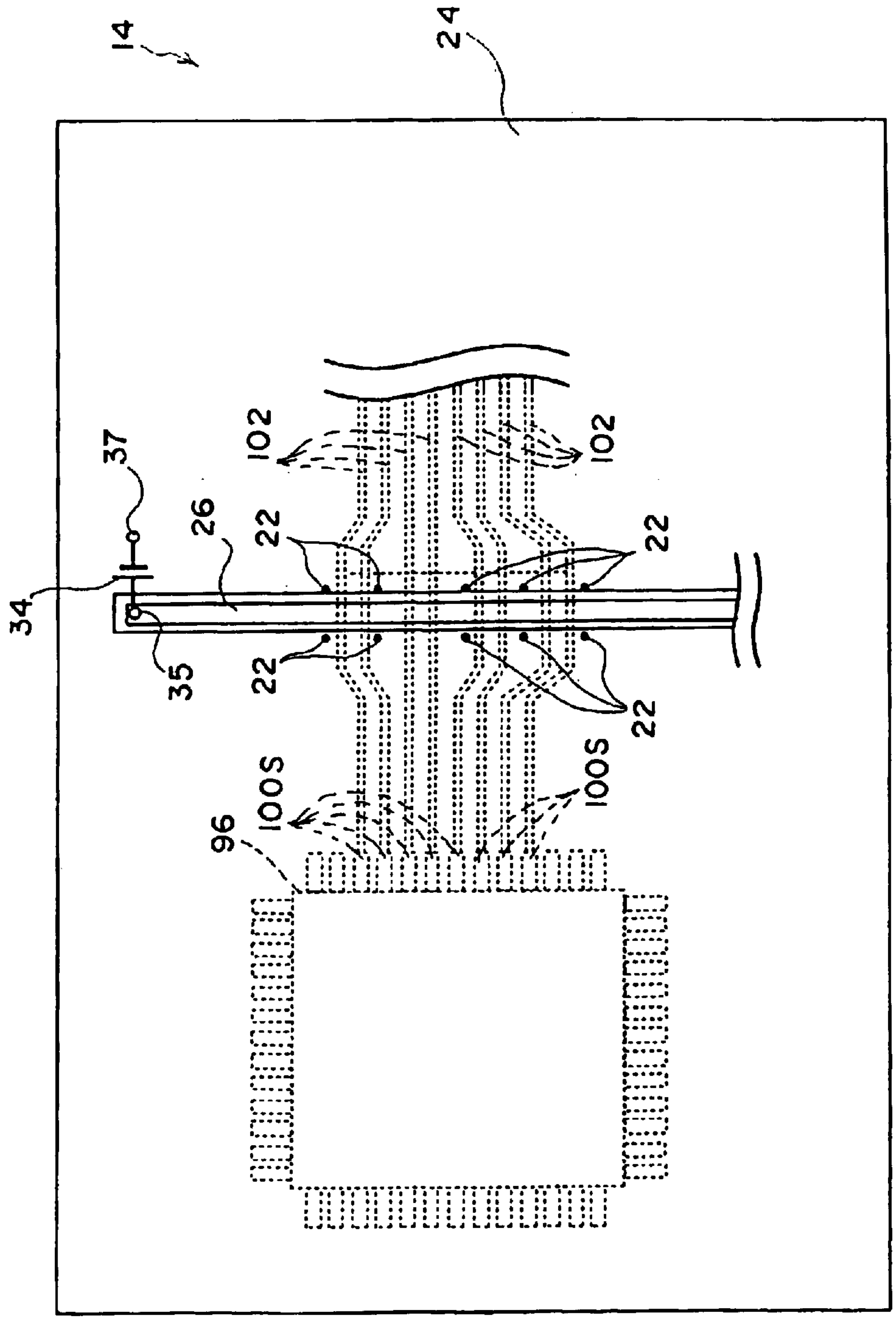
FIG. 6 is a schematic plan view of a first ground layer of a printed wiring board relating to a fourth embodiment.

FIG. 6 is a schematic plan view of the first ground layer 14 in the printed wiring board relating to the present embodiment. As shown in FIG. 6, at the first ground layer 14, the ground pattern 24 and the first power source wire 26 are formed so as to be isolated and independent. The first power source wire 26 crosses (crosses at a right angle) respective projected lines, on the first ground layer 14, of the plural signal wires 102 forming buses which are connected to the plural signal terminals 100S of the IC 96.

A plurality of the via holes 22 are provided in vicinities of the positions where the projected lines, on the first ground layer 14, of the plural signal wires 102 cross the first power source wire 26. In FIG. 6, via holes 22 are disposed, on both sides of the first power source wire 26, every other two signal wires. By arranging the via holes 22 in this way, the path of the return current corresponding to the signal current flowing through the signal wires 102 can be made to be the shortest, and the quality of signal transmission and receipt by the buses can be improved.

Next, the optimal positions of the via holes 22 disposed on both sides of the first power source wire 26, or the optimal distance L from the via hole 22 to a slit between the ground pattern 24 and the first power source wire 26, will be described.

The return current flowing on the ground pattern 24 of the first ground layer 14 ideally has the opposite phase as the signal current flowing on the signal wires 102. The common mode current increases together with the offset from the opposite phase, and is a maximum when the return current is offset by a half-wave length and the return current and the signal current are the same phase. Accordingly, in order to eliminate common mode current at every frequency band, shorter detours for the return current are better. Thus, it is preferable that the distance L from the via hole 22 to the slit between the ground pattern 24 and the first power source wire 26 is about $\lambda/10$ (about 7 mm in a case in which the frequency is about 1 GHz), at which the phase difference due to the detour of the return current is sufficiently small. Here, $\lambda$ is the wavelength of the signal.

The present inventors have confirmed that if the distance L, from the via hole 22 to the slit between the ground pattern 24 and the first power source wire 26, is about 5 mm or less, the radiation of electromagnetic waves at frequencies of about 1 GHz or less can be suppressed to the same extent as in a case in which there is no slit, i.e., a case in which the first power source wire 26 is not wired. Note that even in cases in which the distance L is 10 mm, it has been confirmed that the electromagnetic wave radiation increases by about 2 dB.

In this way, by making the distance L, from the via hole 22 to the slit between the ground pattern 24 and the first power source wire 26, be about $\lambda/10$, even high frequency noise of about 1 GHz can be sufficiently suppressed.

Note that, in all of the above-described embodiments, it is preferable to connect, to the power source wire, capacitors of a sufficient number and sufficient capacity in order to stabilize the DC electric potential. Further, it is preferable to connect a capacitor for decoupling to the power source input terminal of the IC. Moreover, it is preferable to insulate, at high frequencies, the power source wire and the power source input terminal of the digital IC which operates at high speed, by a filter element such as a ferrite chip inductor or the like, and for there to be sufficient decoupling at the tip of the filter element.

EXAMPLES

Figure 8:
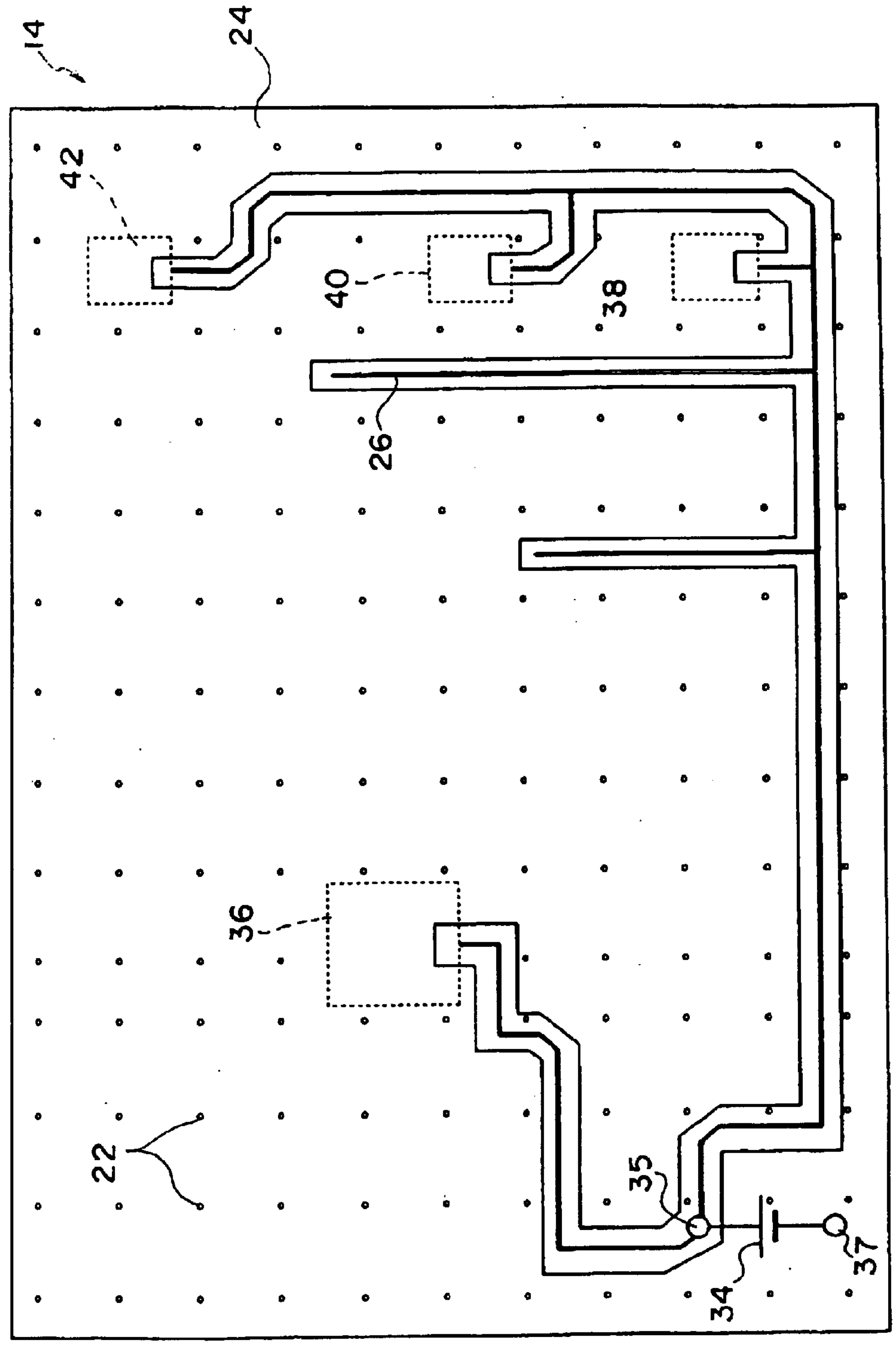
FIG. 8 is a schematic plan view of a first ground layer of a printed wiring board relating to an Example of the present invention.

Next, Examples of the present invention will be described. FIG. 8 is a plan view of the first ground layer 14 of the printed wiring board used in the experiment, and FIG. 9 is a plan view of the first signal wire layer 12 adjacent to the first ground layer 14.

Figure 9:
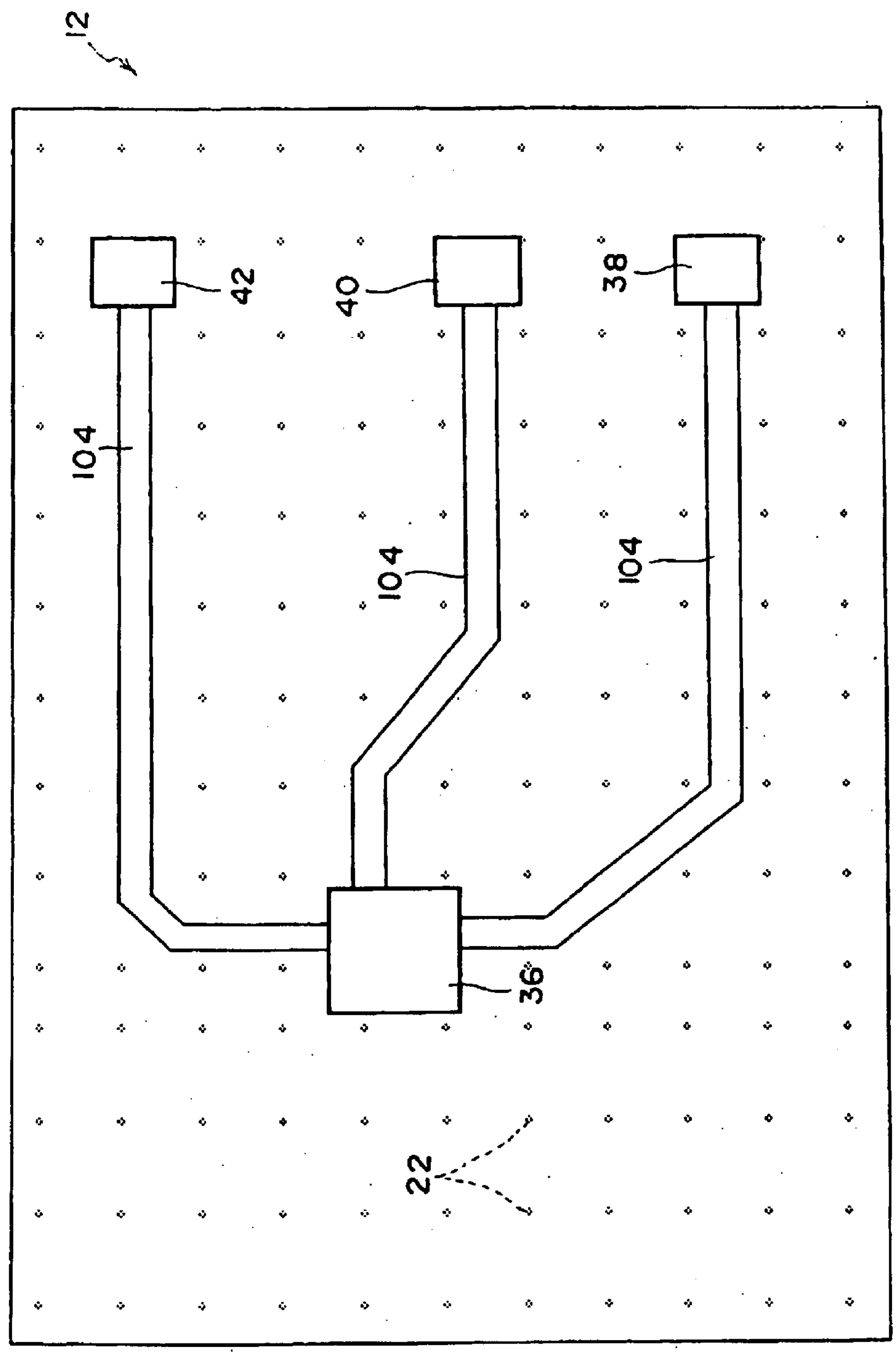
FIG. 9 is a schematic plan view of a first signal wire layer of the printed wiring board relating to the Example of the present invention.

This printed wiring board is A4-sized, and, as shown in FIG. 9, the IC 36 serving as a computation element, and the ICS 38, 40, 42 serving as receiving elements, are mounted to the first signal wire layer 12. The IC 36 and the ICs 38, 40, 42 are connected by 16-bit bus wires 104, respectively.

The ICs 38, 40, 42 are LVCMOS logic buffers. The IC 36 randomly drives the respective bus wires 104 at the LVCMOS level, synchronously with clock signals whose frequencies are 20 MHz. A large number of the via holes 22 are disposed at intervals of 100 mm.

As shown in FIG. 8, DC voltage is supplied by the first power source wire 26 to the ICs 36, 38, 40, 42. As shown in FIGS. 8 and 9, respective portions of the bus wires 104 and (projected lines of) portions of the first power source wire 26 cross one another.

Figure 10:
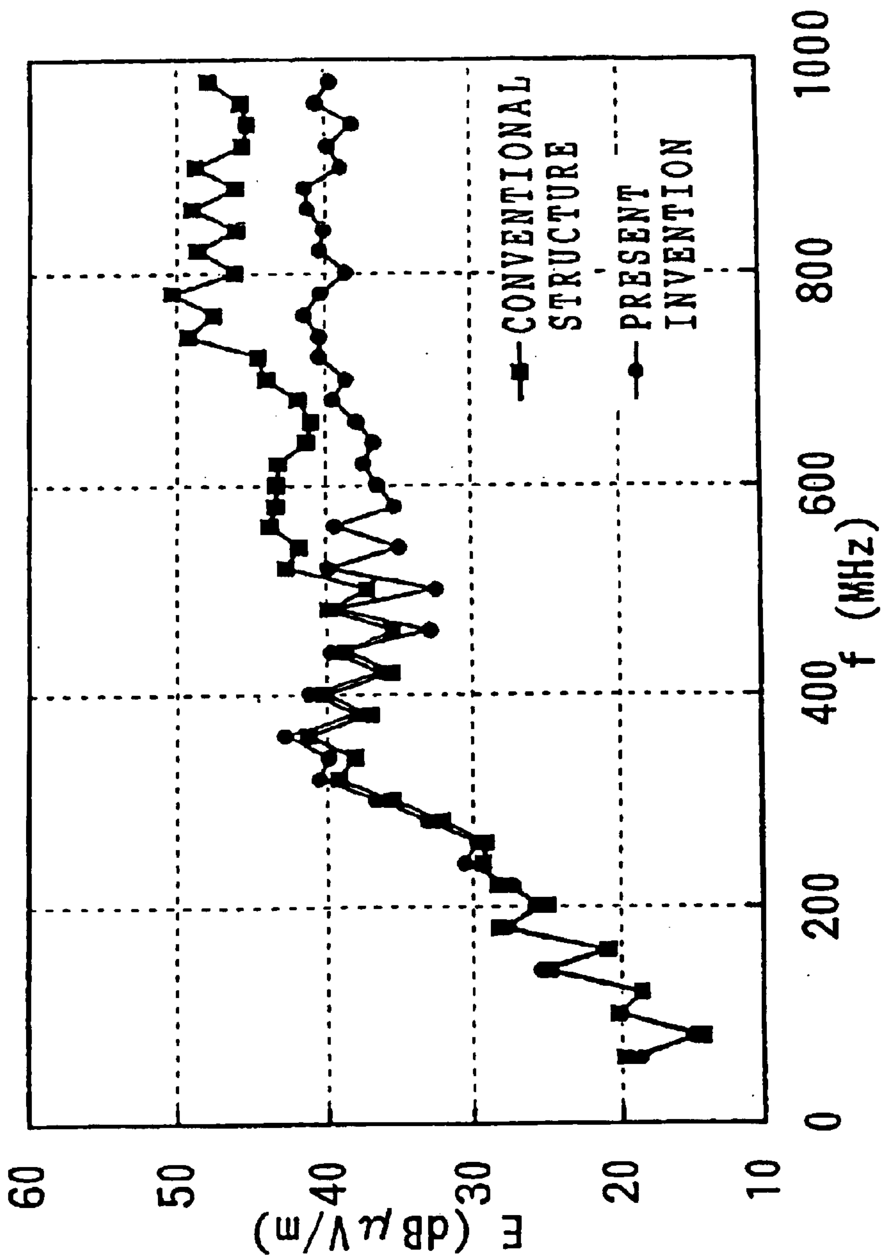
FIG. 10 is a graph showing results of measurement of electromagnetic wave radiation spectra of the printed wiring board relating to the Example of the present invention and a printed wiring board of a conventional structure.

The results of measurement of electromagnetic wave radiation spectra at the printed wiring board having this structure and at a printed wiring board having a conventional structure are shown in FIG. 10.

Note that the printed wiring board of the conventional structure which was used in the measurement is a four-layer board in which a first signal layer, a power layer, a ground layer, and a second signal layer are laminated in that order. Low inductance chip capacitors (of a capacity of 0.1 μF) are connected at intervals of about 20 mm between the power layer and the ground layer. Moreover, by providing, at the peripheral sides of the board, snubber circuits in which the aforementioned chip capacitors and resistors having resistance values of about 5Ω are connected in series, the electromagnetic wave radiation due to resonance current between the opposing power layer and ground layer is suppressed.

As is clear from FIG. 10, with the printed wiring board to which the present invention is applied and which is shown in FIGS. 8 and 9, in all bands of frequencies of about 500 MHz and more, the electromagnetic wave radiation is reduced more than with the printed wiring board having the conventional structure.

In this way, even in a case in which the power source wire and the bus wire cross and the path along which the return current, which corresponds to the signal current flowing through the bus wire, flows is cut midway therealong, a large number of the via holes are provided at uniform intervals, and therefore, the return current can be made to detour along the shortest path, and high frequency electromagnetic wave radiation can be suppressed.

In accordance with the present invention, there is no need to change the structure of the printed wiring board itself that much from that of a conventional printed wiring board. Moreover, the number of capacitors, snubber circuits, and the like, which are needed in the printed wiring board of the conventional structure, can be reduced. In addition, there is no need to provide a guard earth at the end portion of the power layer. Thus, the number of parts can be reduced, the cost can greatly be reduced, and the degrees of freedom in design can be greatly increased.

Next, explanation will be given of results of simulating how electromagnetic wave radiation noise changes due to the positions at which the power source wire is formed and the like, in a case in which noise is generated at the power source wire. Note that an electromagnetic field simulation in accordance with an FI (finite integration) method was used as the simulation method.

Figure 14A:
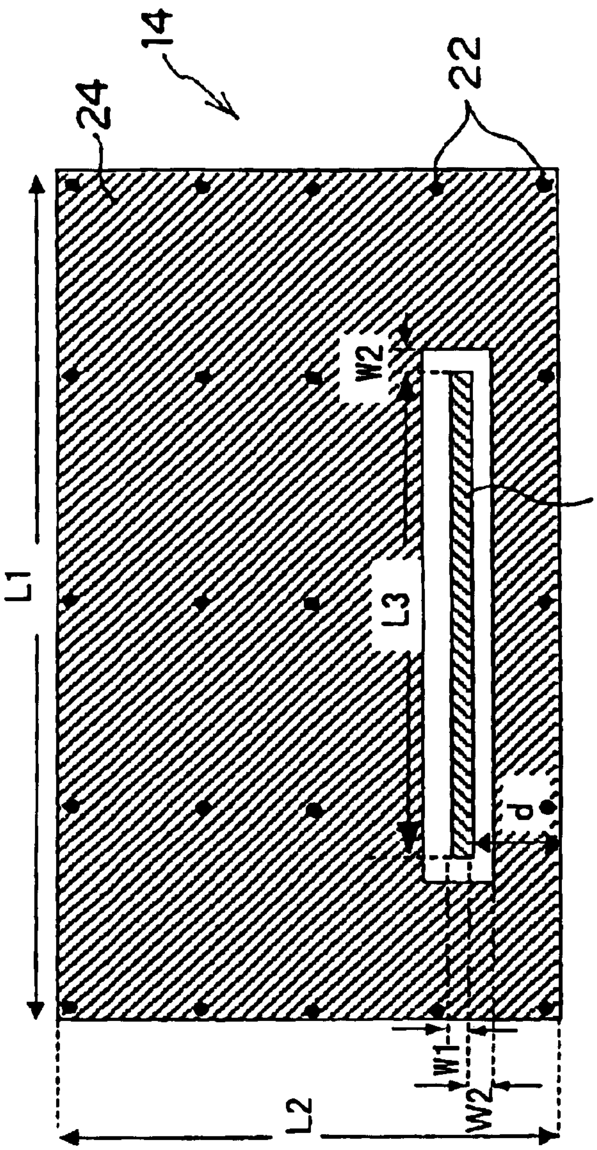
FIG. 14A is a plan view of a board model used in a simulation.
Figure 14B:
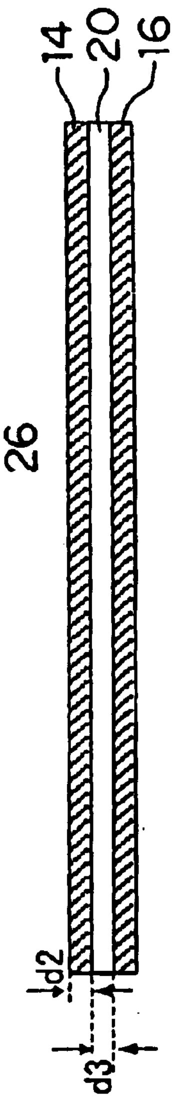
FIG. 14B is a sectional view of FIG. 14A.
Figure 15A:
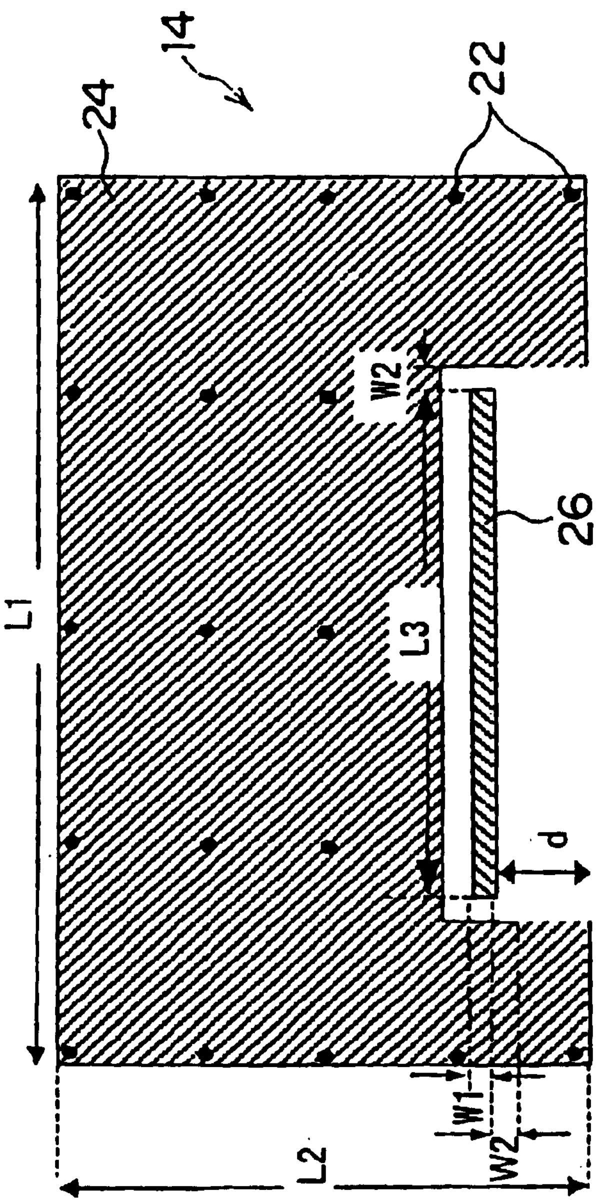
FIG. 15A is a plan view of a board model used in a simulation.
Figure 15B:
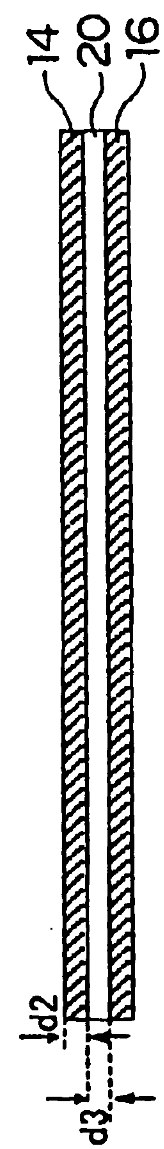
FIG. 15B is a sectional view of FIG. 15A.
Figure 16:
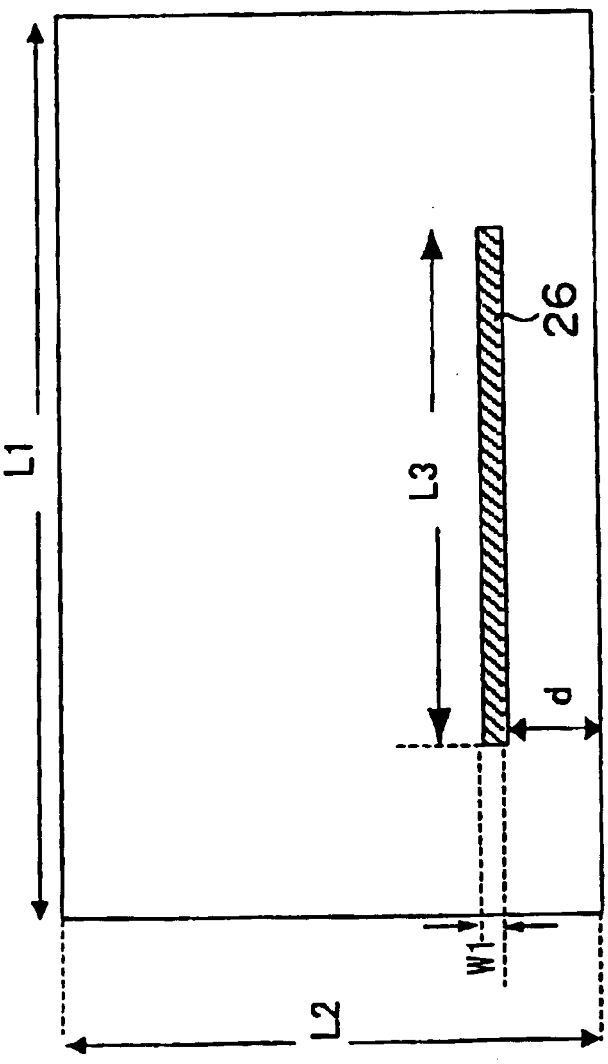
FIG. 16 is a plan view of a board model used in a simulation.

FIGS. 14 through 16 show models 1 through 3 used in the simulations. FIG. 14A is a plan view of model 1 in accordance with the present invention. FIG. 14B is a sectional view of FIG. 14A. Model 1 is a model in which the power source wire 26 is formed at the inner side, with the ground pattern 24 being disposed between the power source wire 26 and the end portion of the board. Namely, model 1 is a model in which the power source wire 26 is surrounded by the ground pattern 24.

In the model shown in FIG. 14A, the ground pattern 24 and the power source wire 26 are formed on the first ground layer 14 of a board whose lateral length L1 is 180 mm and whose vertical length L2 is 100 mm. A length L3 of the power source wire 26 is 100 mm, and a width W1 thereof is 2 mm. A slit having a width W2 of 0.5 mm is formed between the power source wire 26 and the ground pattern 24.

As shown in FIG. 14B, the first ground layer 14 is laminated on the second ground layer 16 via the insulating material 20. A ground pattern is formed over the entire surface of the second ground layer.

A thickness d2 of each of the first ground layer 14 and the second ground layer 16 is 0.035 mm. A thickness d3 of the insulating material is 0.8 mm, and a dielectric constant ∈ thereof is 4.7. The first ground layer 14 and the second ground layer 16 are connected by a large number of the via holes 22.

FIGS. 15A and 15B are respectively a plan view and a sectional view of a model 2 in which the power source wire 26 is provided without the ground pattern 24 being disposed between the power source wire 26 and the end portion of the board. Note that the sizes and the structures, other than the point that the power source wire 26 is provided without the ground pattern 24 being disposed between the power source wire 26 and the end portion of the board, are the same as those of FIG. 14.

FIG. 16 is a plan view of model 3 in which the ground pattern 24 is not provided at the first ground layer 14, and only the power source wire 26 is provided. The other structures and sizes are the same as those of the model shown in FIG. 14. Namely, model 3 is a model in which the only ground layer is the second ground layer 16.

Figure 17:
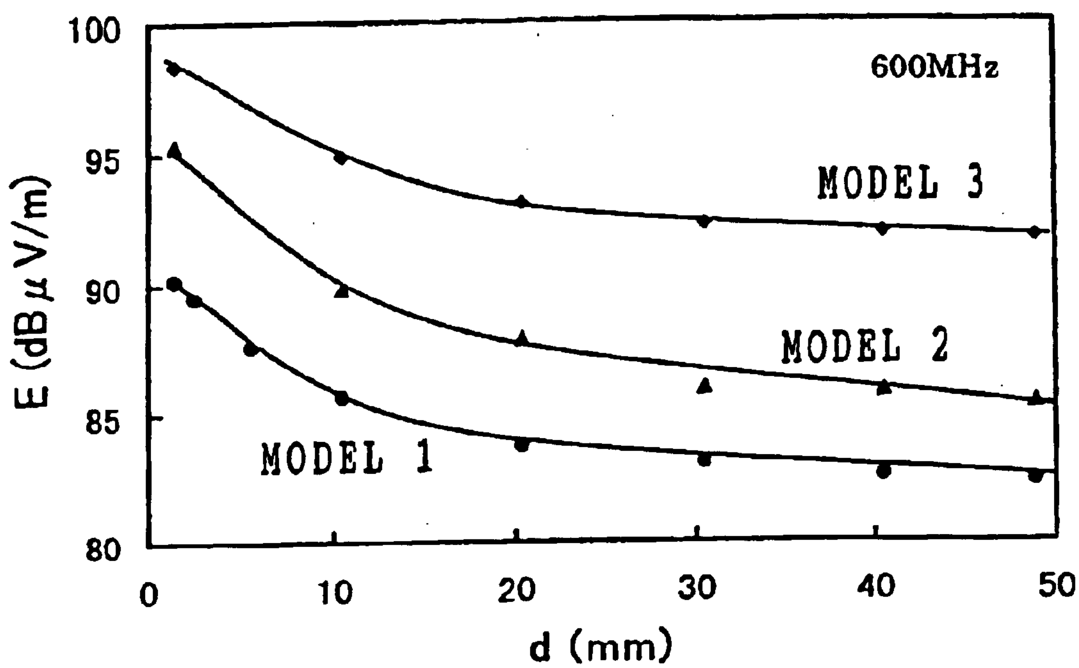
FIG. 17 is a graph showing the relationship between distance from a board end portion to a power source wire, and intensity of electromagnetic wave radiation noise.

The results of simulating, for each of models 1 through 3 and in accordance with a distance d from the board end portion to the power source wire 26, the electromagnetic wave radiation noise intensity when noise is applied to the end portion of the power source wire 26, are shown in FIG. 17. Note that the frequency of the electromagnetic wave radiation noise is 60 MHz.

As is clear from FIG. 17, the electromagnetic wave radiation noise is the lowest when the power source wire 26 is surrounded by the ground pattern 24. Further, when one side of the ground pattern 24 is removed as in model 2, the electromagnetic wave radiation noise is greater than in model 1, but is less than that in the case in which the ground pattern 24 does not exist at all at the periphery of the power source wire 26 as in model 3. Namely, it can be understood from FIG. 17 that forming the power source wire 26 within the ground layer is effective for noise reduction. Moreover, it can be understood that forming a ground region at the entire periphery of the power source wire 26 is most effective for noise reduction.

In order to lower the intensity of the electromagnetic wave radiation noise by 3 dB from that in a case in which the power source wire 26 is disposed at the end portion of the board, the power source wire 26 must be placed about 3 mm away from the board end. In order to lower the intensity by 6 dB, the power source wire 26 must be placed about 5 mm away from the board end. The power source wire 26 is preferably set away by around 10 mm or more from the end of the board. In this way, the electromagnetic wave radiation noise can be effectively reduced.

Moreover, it can be seen from FIG. 17 that the greater the distance d from the end portion of the board to the power source wire 26, the more the electromagnetic wave radiation noise is reduced. Note that, the results of simulation for other frequencies as well were the same.

Figure 18:
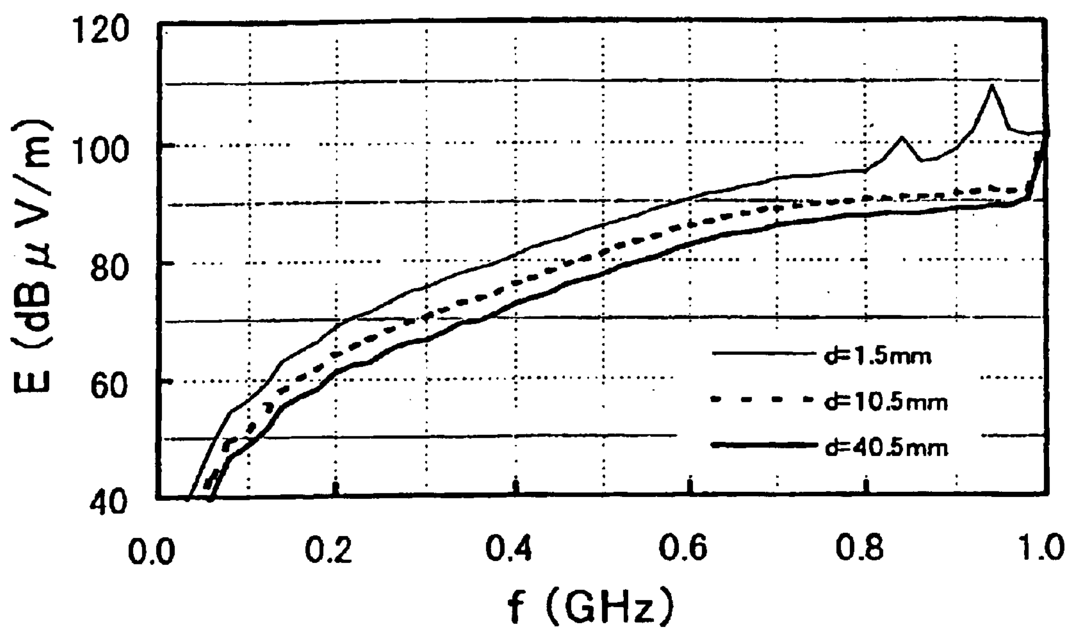
FIG. 18 is a graph showing the relationship between frequency and intensity of electromagnetic wave radiation noise.

Moreover, FIG. 18 shows the results of simulation of electromagnetic wave radiation noise at the time when noise is applied to the end portion of the power source wire 26 in a case in which the distance d in model 1 is varied. As can be seen from FIG. 18, the greater the distance d, the greater the reduction in electromagnetic wave radiation noise at all frequency bands.

[Fifth Embodiment]

A fifth embodiment of the present invention will now be described. In the present embodiment, explanation will be given of an example in which a snubber circuit is connected to the end portion of the power source wire. Note that portions which are the same as those of the above-described embodiments are denoted by the same reference numerals, and detailed description thereof is omitted.

Figure 19A:
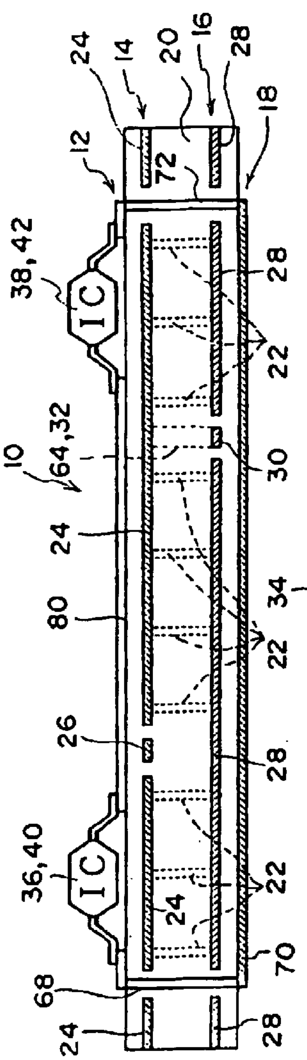
FIG. 19A is a sectional view, taken along line A—A, of a printed wiring board relating to a fifth embodiment and shown in FIG. 19B.
Figure 19B:
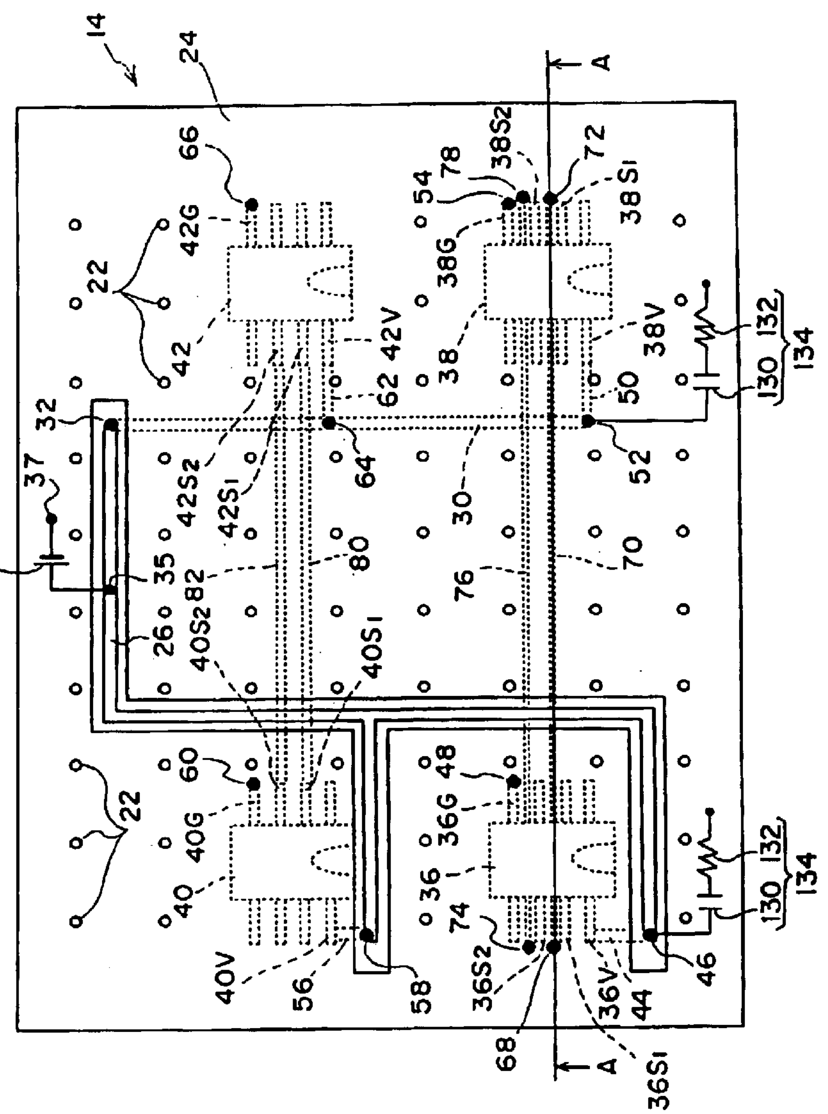
FIG. 19B is a schematic plan view of FIG. 19A.

FIG. 19 is a schematic sectional view of the printed wiring board 10 relating to the present embodiment. FIG. 19B is a plan view of the first ground layer 14, and FIG. 19A is a sectional view taken along line A—A of FIG. 19B.

As shown in FIG. 19B, a snubber circuit 134, in which a capacitor 130 and a resistor 132 are connected in series, is connected between the terminal portion of the power source wire 26 and the ground pattern 24 (or the ground pattern 28). The snubber circuit 134 is provided at the first signal wire layer 12 or the second signal wire layer 18. Similarly, the snubber circuit 134 is connected to the terminal portion of the power source wire 30 as well. Note that the ground side of the snubber circuit 134 is preferably directly coupled to the ground pattern 24 and the ground pattern 28 by the via holes 22.

The impedances of the snubber circuits 134 match the characteristic impedances of the power source wires 26, 30. Here, the characteristic impedance in the case of a structure in which the ground pattern 24 and the power source wire 26, which form a so-called coplanar wire path, are laminated on the ground pattern 28 via the insulating material 20 which is a dielectric layer, such as the case of the printed wiring board shown in FIG. 19, is determined in accordance with the method disclosed in Brian C. Wadell, "Transmission Line Design Handbook", Artech House Inc., 1991, p. 79.

Figure 27:
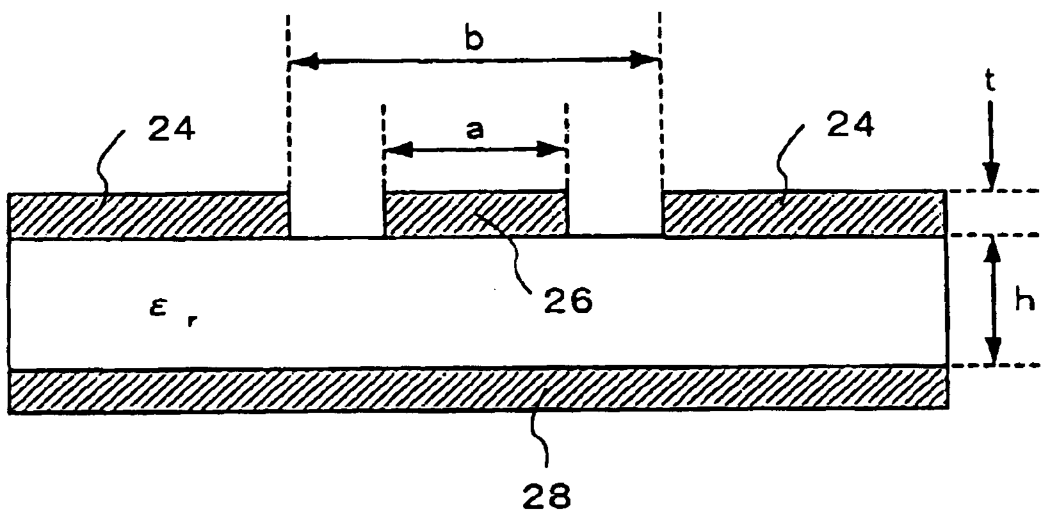
FIG. 27 is a sectional view of a board using a coplanar wire path.

Namely, as shown in FIG. 27, given that the width of the power source wire 26 is a, the distance from the power source wire 26 side end portion of the one ground pattern 24 to the power source wire 26 side end portion of the other ground pattern is b, the height of the insulating material 20 is h, and the dielectric constant of the insulating material 20 is $\in_r$, the characteristic impedance $Z_0$ is expressed by the following formula.

$$Z_0 = \frac{\eta_0}{2.0\sqrt{\varepsilon_{eff}}}\frac{1.0}{\frac{K(k)}{K(k')}+\frac{K(k_1)}{K(k_1')}} \quad (1)$$

where $$k=a/b \quad (2)$$

$$k'=\sqrt{1.0-k^2} \quad (3)$$

$$k_1'=\sqrt{1.0-k_1^2} \quad (4)$$

$$k_1 = \frac{\tanh\left(\frac{\pi a}{4.0h}\right)}{\tanh\left(\frac{\pi b}{4.0h}\right)} \quad (5)$$

$$\varepsilon_{eff} = \frac{1.0+\varepsilon_r\frac{K(k')}{K(k)}\frac{K(k_1)}{K(k_1')}}{1.0+\frac{K(k')}{K(k)}\frac{K(k_1)}{K(k_1')}} \quad (6)$$

$$\eta_0 = \sqrt{\frac{\mu_0}{\varepsilon_0}} \quad (7)$$

Here, $\mu_0$ is the magnetic permeability in a free space, and is $4\pi\times10^{-7}$ (H/m). $\in_0$ is the dielectric constant in a free space and is $8.854183\times10^{-12}$ (F/m). $\eta_0$ is the characteristic impedance in a free space and is $120\pi\Omega$. $\in_{eff}$ is the effective relative dielectric constant, and K0 is a function of the complete elliptic integral of the first kind.

In this way, by connecting the snubber circuit, which has an impedance matching the characteristic impedance of the power source wire, to the terminal portion of the power source wire, it is possible to prevent electromagnetic wave radiation due to one-dimensional resonance from being generated due to reflection at the end portion of the power source wire being repeated.

Figure 20:
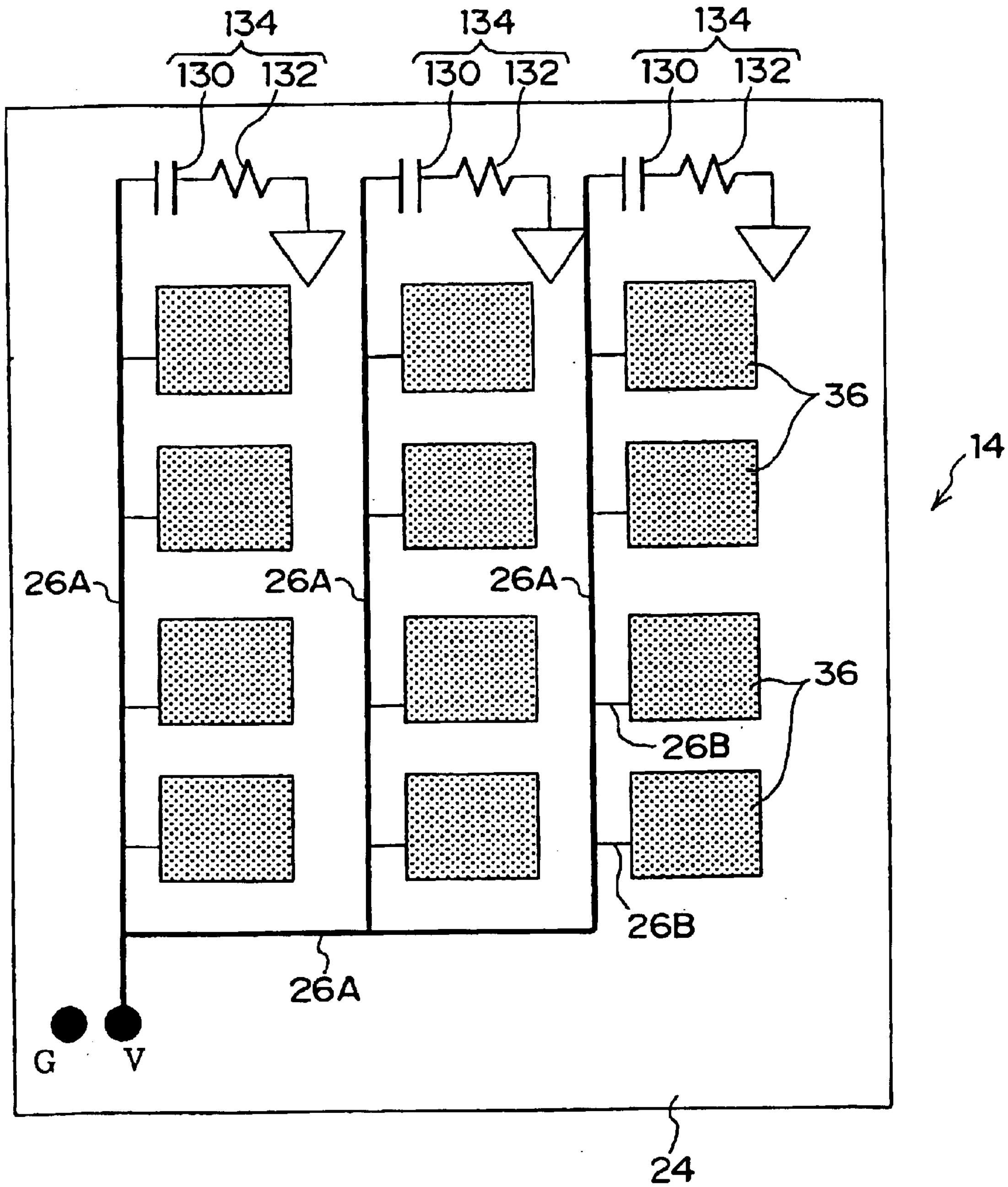
FIG. 20 is a plan view showing an example of an arrangement of snubber circuits of the printed wiring board relating to the fifth embodiment.
Figure 21:
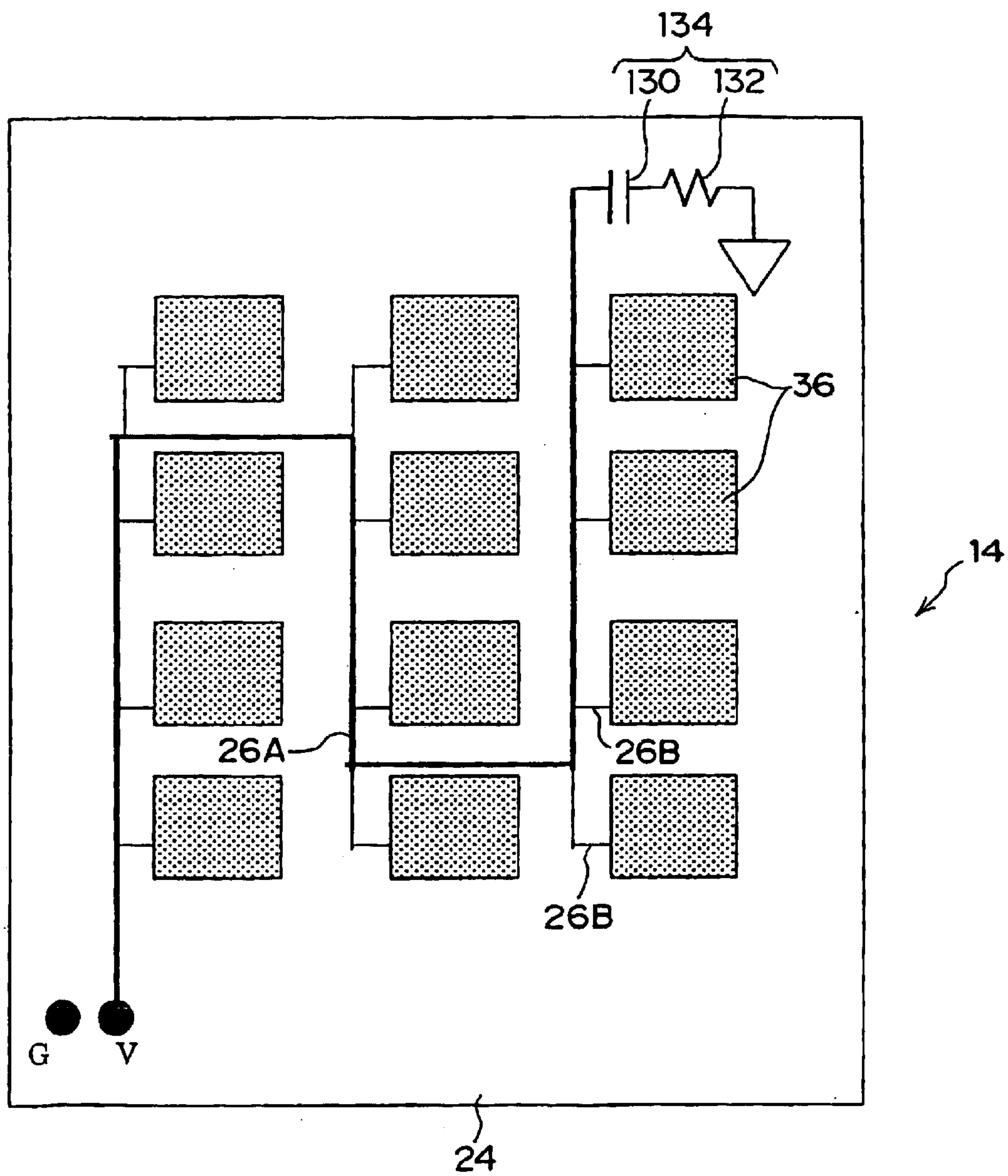
FIG. 21 is a plan view showing an example of an arrangement of the snubber circuit of the printed wiring board relating to the fifth embodiment.
Figure 22:
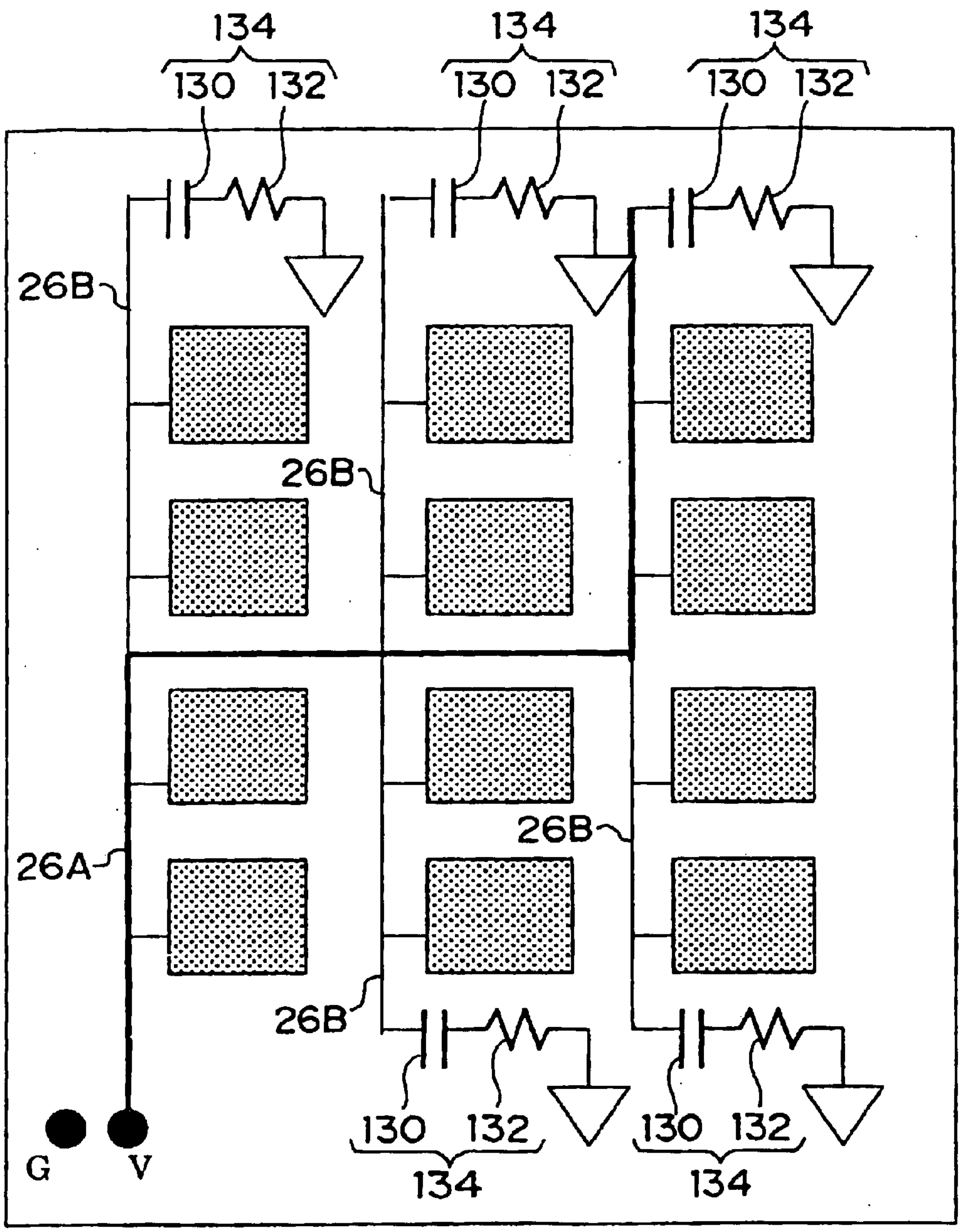
FIG. 22 is a plan view showing an example of an arrangement of the snubber circuits of the printed wiring board relating to the fifth embodiment.

FIGS. 20 through 22 show images of examples of arrangements of the snubber circuits 134 connected to the power source wire 26.

As shown in FIG. 20, the power source wire 26 is wired at the first ground layer 14, and a plurality (12 in FIG. 20) of the ICs 36 are disposed on the first signal wire layer 12 which is above the first ground layer 14. The power source wire 26 is formed from main power source wires 26A and branch power source wires 26B which are branched off from the main power source wires 26A. Power is supplied to the respective ICs 36 from the branch power wires 26B via via holes.

In order for the main power source wires 26A to pass by vicinities of the respective ICs 36, the main power source wires 26A are branched into plural (three in FIG. 20) main power source wires 26A. The lengths of the branch power source wires 26B branched off from the respective main power source wires 26A can thereby be made to be as short as possible. In this way, the main power source wires 26A are main power source wires for supplying power to the respective ICs 36. The branch power source wires 26B are power source wires whose lengths are shorter than those of the main power source wires 26A and which are for supplying, to the ICs 36, power supplied from the main power source wires 26A.

The snubber circuit 134, in which the capacitor 130 and the resistor 132 are connected in series, is connected to the final end of each of the branched-off main power source wires 26A. The snubber circuits 134 are disposed, for example, on the first signal wire layer 12. One end of the snubber circuit 134 is connected to the final end of the main power source wire 26A via a via hole, and the other end of the snubber circuit 134 is connected to the ground pattern 24 via a via hole.

In this way, because the snubber circuits are provided at the terminal portions of the branched-off main power source wires 26A, it is possible to prevent electromagnetic wave radiation, which is due to one-dimensional resonance, from being generated due to reflection being repeated at the terminal portion of the power source wire.

Because the branch power source wire 26B is sufficiently short, reflection from the end portion thereof is not particularly problematic.

Further, as shown in FIG. 21, it is possible to not branch the main power source wire 26A, and for a single main power source wire 26A to pass by vicinities of the respective ICs 36. By wiring in this way, the branch power source wires 26B connected to the respective ICs 36 can be made to be sufficiently short, and it suffices to connect a snubber circuit 134 to the terminal portion of the one main power source wire 26A. Thus, the number of parts can be reduced.

Further, as shown in FIG. 22, in a case in which the branch power source wires 26B are long, it is preferable to provide the snubber circuits 134 at the terminal portions of the branch power source wires 26B as well.

Next, the results of simulation of electromagnetic wave radiation noise at the following three boards will be described. One board is a board having a conventional structure, i.e., a structure in which the power layer and the ground layer oppose one another. The next is a board having the structure relating to the present invention in which the power source wire is wired at the ground layer. The final board is a board having the structure relating to the present invention in which the power source wire is wired at the ground layer, and having a snubber circuit provided at the terminal portion of the power source wire.

Figure 23:
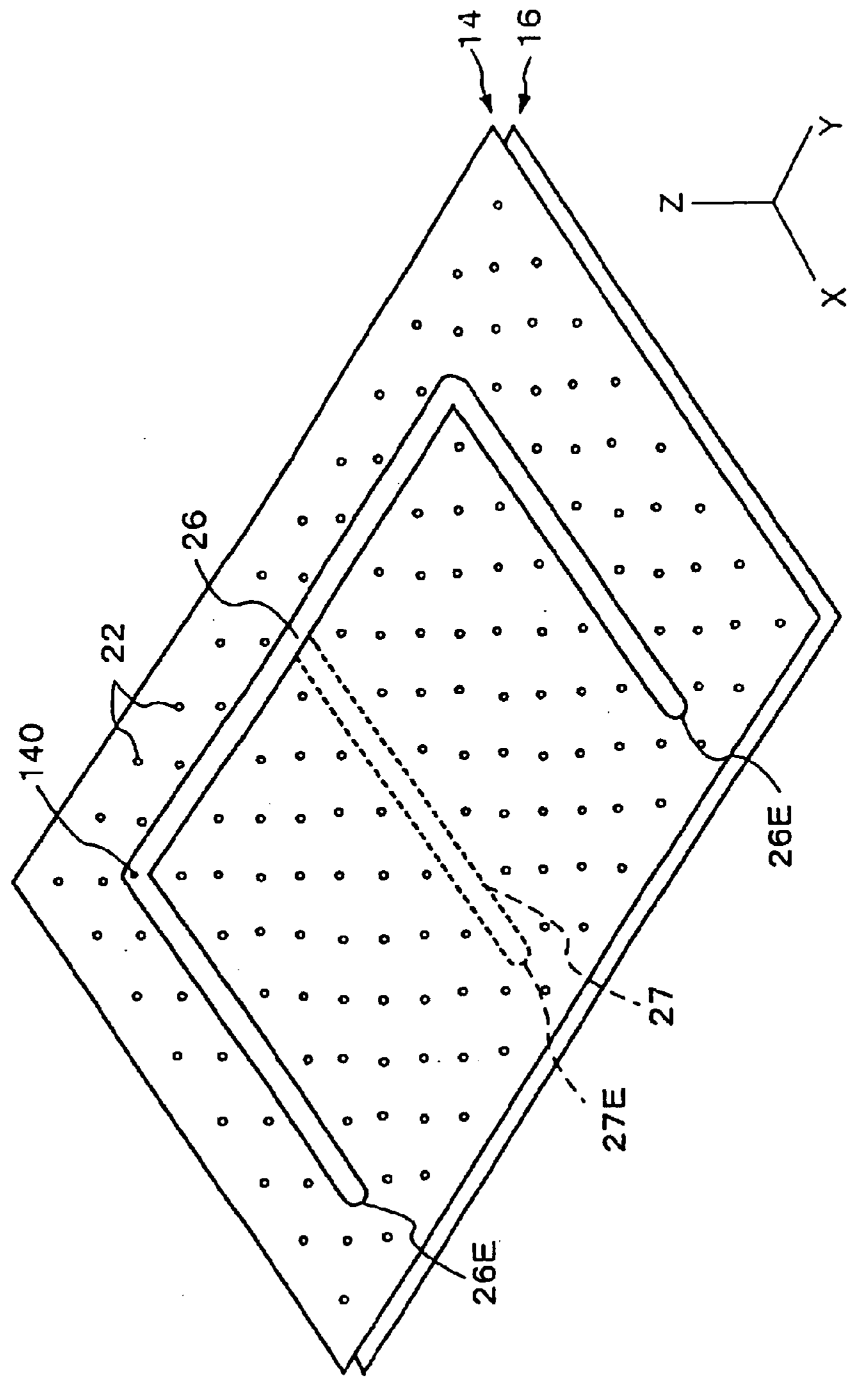
FIG. 23 is a perspective view of a board model of the present invention used in a simulation.
Figure 24:
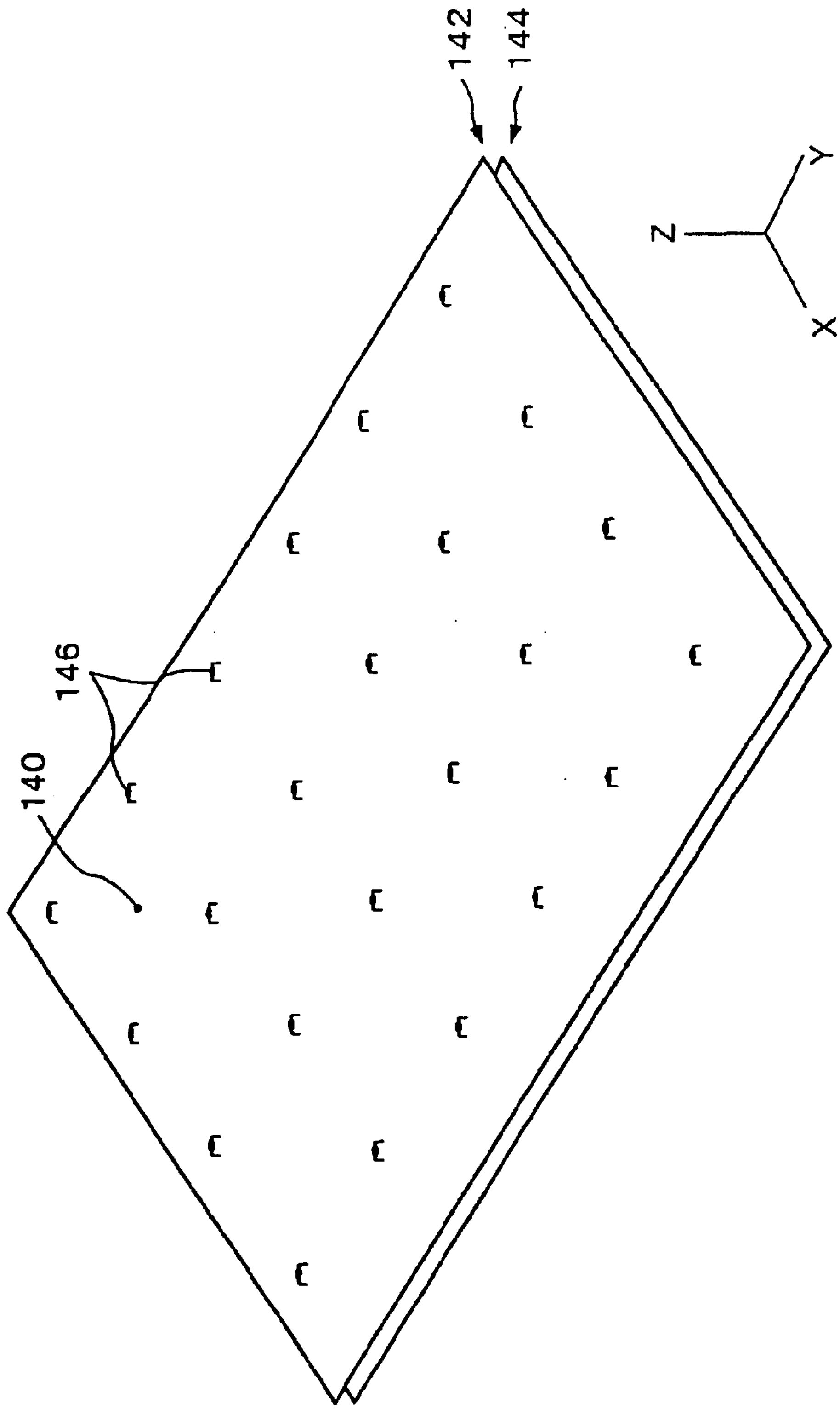
FIG. 24 is a perspective view of a conventional board model used in a simulation.

FIGS. 23 and 24 are perspective views of models used in the simulation. FIG. 23 shows the board having a structure in accordance with the present invention. The board size is 160 mm×240 mm. The first ground layer 14 and the second ground layer 16 are laminated, and the power source wire 26 is wired at the first ground layer 14. The via holes 22 are formed at a pitch of 20 mm in the ground layers. A driving point 140 is provided midway along the power source wire 26. Although not shown in FIG. 23, a decoupling capacitor having a capacity of 0.1 $\mu$F is disposed at a position 4 mm away from the driving point 140.

FIG. 24 shows the board having the conventional structure. The board size is 160 mm×240 mm, and a power layer 142 and a ground layer 144 oppose one another. Decoupling capacitors 146 are provided at predetermined intervals over the entire surface. Further, the driving point 140 is provided at the same position as in FIG. 23.

Figure 25:
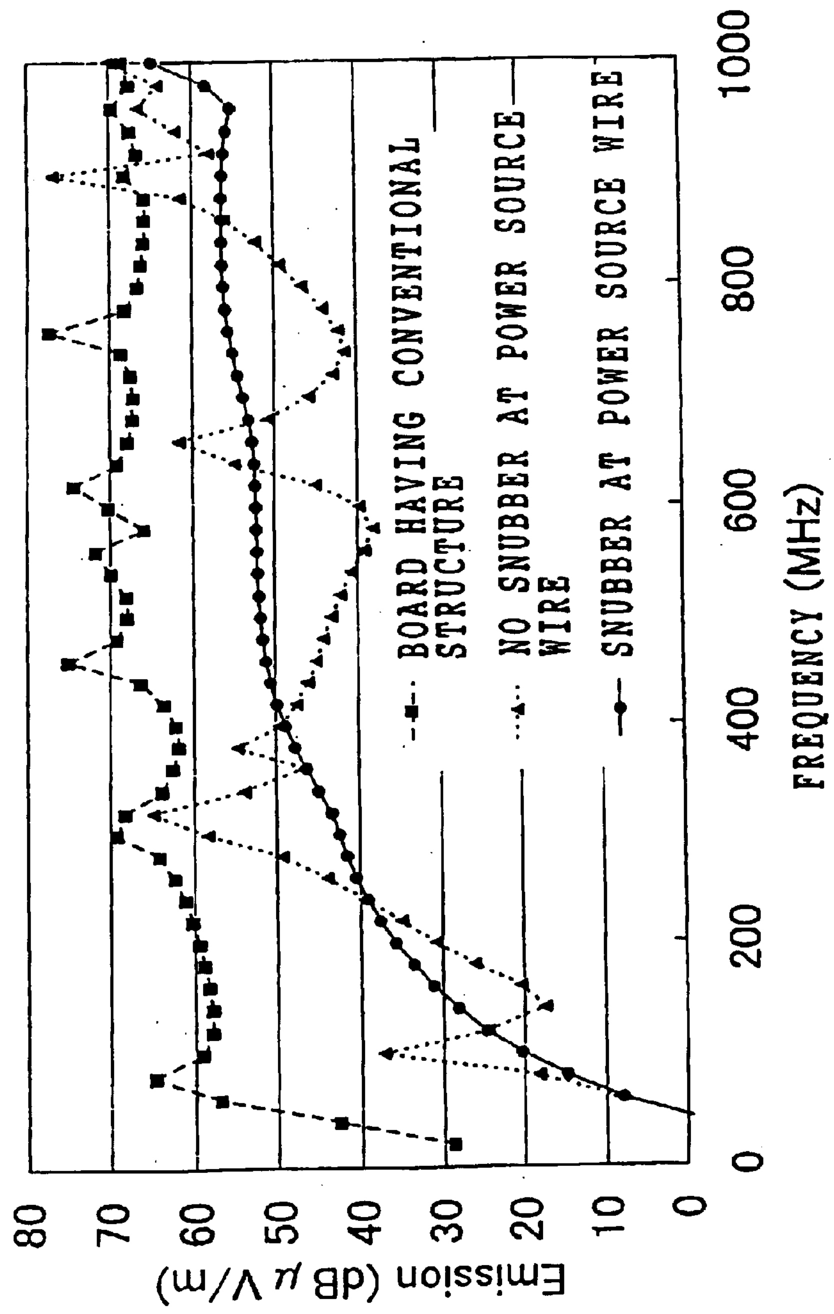
FIG. 25 is a graph showing the relationship between frequency and intensity of electromagnetic wave radiation noise.

The results of simulation of electromagnetic wave radiation noise at these models are shown in FIG. 25.

FIG. 25 shows the results of simulation of electromagnetic wave radiation noise of the board having the conventional structure shown in FIG. 24, and the board relating to the present invention and shown in FIG. 23 and having a structure in which the power source wire 26 is wired at the first ground layer 14, and a board relating to the present invention and shown in FIG. 23 and having a structure in which the power source wire 26 is wired at the first ground layer 14 and having snubber circuits at terminal portions 26E of the power source wire 26.

As can be understood from FIG. 25, by wiring the power source wire, the electromagnetic wave radiation can be suppressed more than with the board having the conventional structure. Moreover, when the snubber circuits are not provided at the power source wire, radiation peaks at predetermined frequencies of the electromagnetic wave radiation based on the resonance of the power source remain. However, by providing the snubber circuits at the terminal portions of the power source wire, the radiation peaks can be suppressed with respect to all frequency bands.

Figure 26:
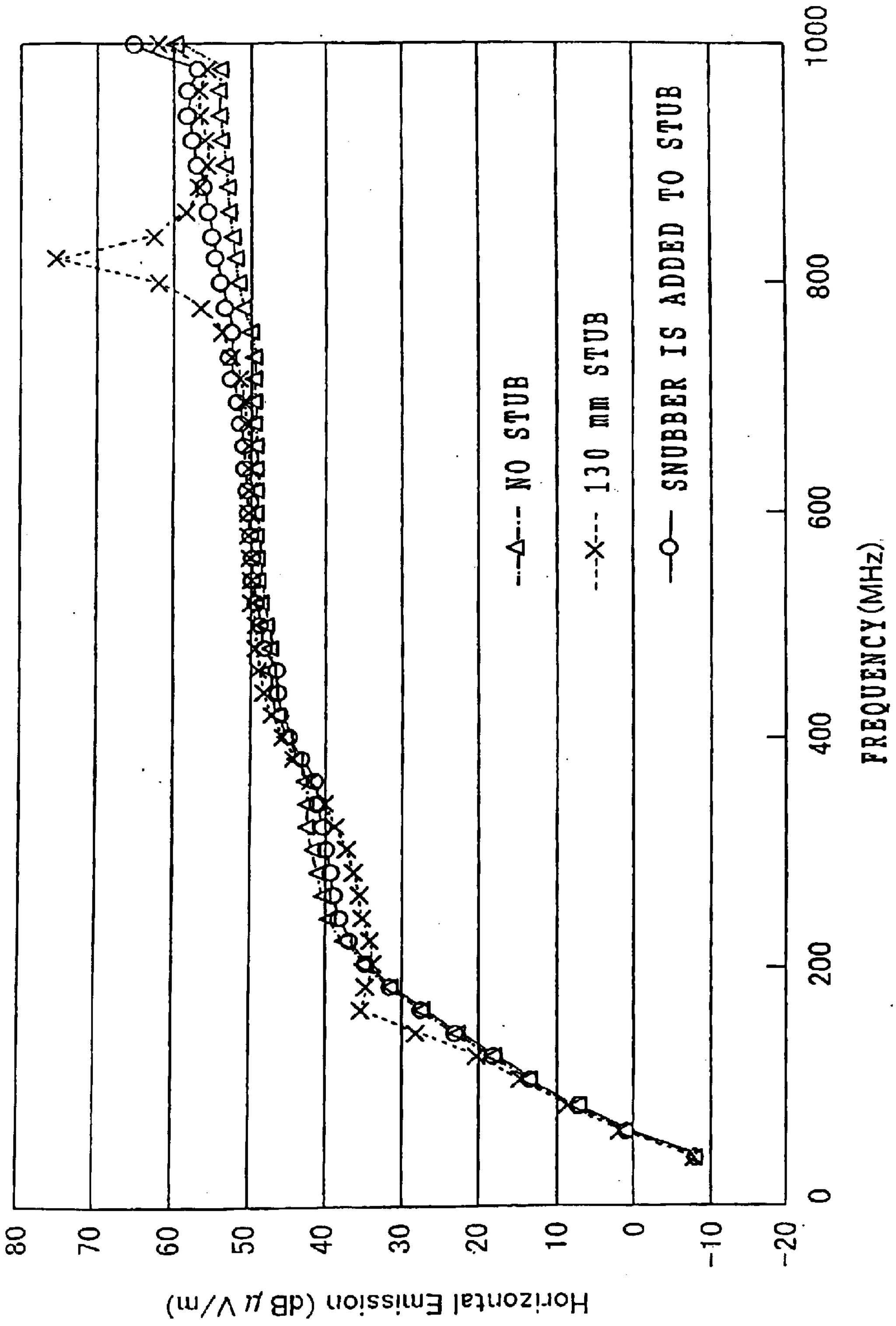
FIG. 26 is a graph showing the relationship between frequency and intensity of electromagnetic wave radiation noise.

FIG. 26 shows the results of simulation of electromagnetic wave radiation noise at the board having the structure shown in FIG. 23 and in which there is a stub (branch power source wire) 27 which is branched off from midway along the power source wire 26, in a case in which a snubber circuit is provided at a terminal portion 27E of the stub 27 and in a case in which no snubber circuit is provided at the terminal portion 27E of the stub 27. Note that the length of the stub is 130 mm.

As can be seen from FIG. 26, in a case in which a snubber circuit is not provided at the stub, there is a radiation peak at a specific frequency (about 800 MHz). However, by providing a snubber circuit at the stub, the radiation peak can be suppressed.

Note that, in the above-described embodiments, cases of a four-layer board in which the first signal wire layer 12, the first ground layer 14, the second ground layer 16, and the second signal wire layer 18 are laminated, are described as examples. However, the present invention is not limited to the same, and is also applicable to two-layer boards in which signal wires are formed in the first ground layer and the second ground layer.

[Sixth Embodiment]

A sixth embodiment of the present invention will now be described. In the present embodiment, explanation will be given of the wire width of the power source wire. Note that portions which are the same as those of the above-described embodiments are denoted by the same reference numerals, and detailed description thereof is omitted.

The wire width of the power source wire is determined on the basis of the current capacity, i.e., the heat generation amount. In other words, the wire width is determined on the basis of the predicted amount of rise in temperature caused by Joule heat. However, because the amount of the rise in temperature varies in accordance with the configuration of the heat dissipating body and the flow of air at the periphery, the amount of the rise in temperature cannot be predicted only from the structure of the wire, and greatly depends on the usage conditions of the printed wiring board.

Further, it is necessary to consider the drop in voltage due to the DC resistance component of the power source wire, in structures, such as those described in the above embodiments, which presuppose usage in a high-speed digital circuit and in which two ground layers are disposed between two signal wire layers.

Accordingly, in structures, such as those described in the above embodiments in which the power source wire is branched in plural directions and a device such as an IC or the like is connected to the distal end of each branch, the length of the power source wire becomes long. When the devices are operated simultaneously at maximum current, there is the concern that it will not be possible to supply sufficient power.

Figure 28:
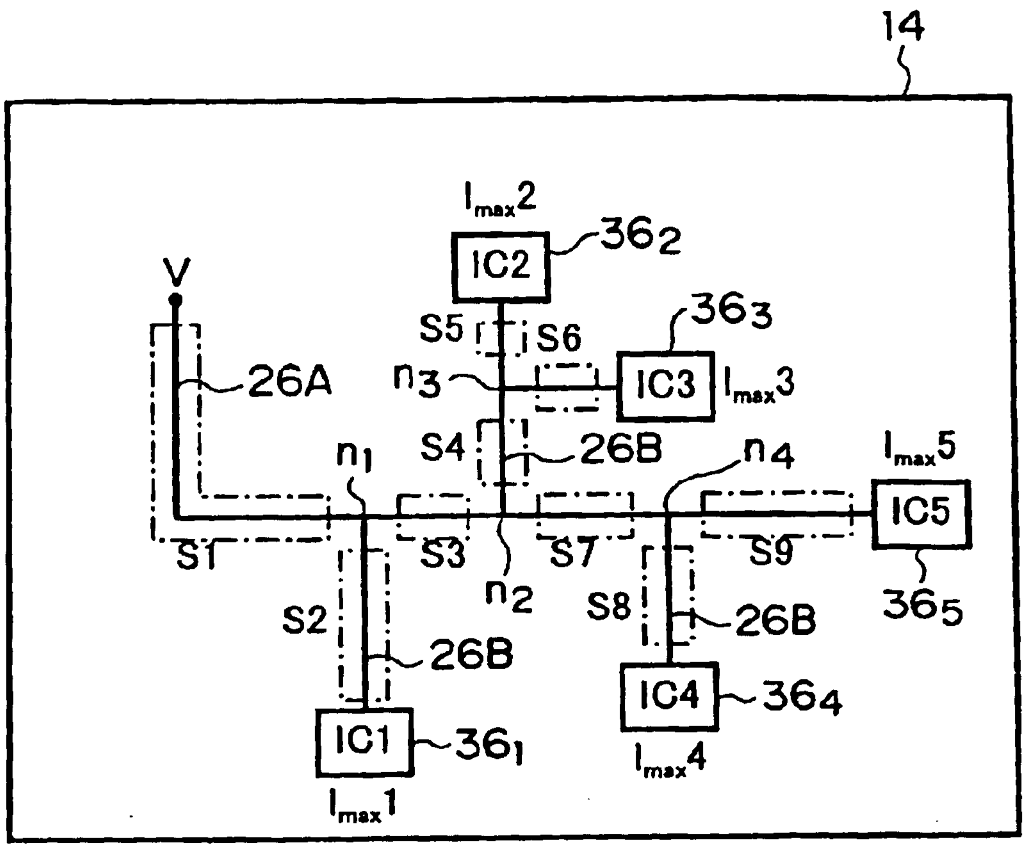
FIG. 28 is a diagram for explaining setting of the width of a power source wire.

Thus, in the present embodiment, as shown in FIG. 28 for example, a minimum needed width of the power source wire, i.e., the main power source wire 26A and the branch power source wires 26B, is set on the basis of maximum current values Imax1 through Imax5 of ICs $36_1$ through $36_5$ which are connected to the branch power source wires 26B branched from the main power source wire 26A and to which power is supplied from a power source input terminal V. Note that, although the width may be greater than or equal to this minimum needed width, from the standpoint of the density of mounting and the like, it is preferable that the width not be needlessly large.

Specifically, as shown in FIG. 28, first, for each of segments S1 through S9, which are obtained by dividing the power source wire at nodes $n_1$ through $n_4$ which are points of intersection of the main power source wire 26A and the branch power source wires 26B, the maximum current value for which there is a possibility of flowing through that segment, is computed. In other words, this is the same as computing the maximum current value which might flow into each of the nodes $n_1$ through $n_4$.

For example, there is the possibility that current of Imax5, which is the maximum current value of the IC $36_5$, flows at the segment S9. Similarly, there is the possibility that current of Imax4, which is the maximum current value of IC$36_4$, flows at the segment S8. Accordingly, there is the possibility that a current value of Imax5+Imax 4 flows at the segment S7. In this way, for each segment, the maximum current value which might flow at that segment is computed.

Then, the width of the power source wire, which width is such that, when current of the maximum current value among the computed current values flows at the power source wire, the rise in temperature of the power source wire is a predetermined value or less and the electric potential differences of the respective nodes are a predetermined value or less, is determined. This width is set as the minimum needed width of the power source wire.

Specifically, for example, the width is set by determining a width which corresponds to the maximum current value among the computed current values, from predetermined corresponding relationships between the widths of power source wires and current values which can flow through power source wires of those widths.

In this way, the width of the power source wire is set to a width corresponding to the maximum current value of current which flows to each segment. Therefore, power can be stably supplied to each IC, and electromagnetic noise radiation can be suppressed effectively.

[Seventh Embodiment]

A seventh embodiment of the present invention will now be described. In the present embodiment, explanation will be given of setting the length of the power source wire. Note that portions which are the same as those of the above-described embodiments are denoted by the same reference numerals, and detailed description thereof is omitted.

Figure 29:
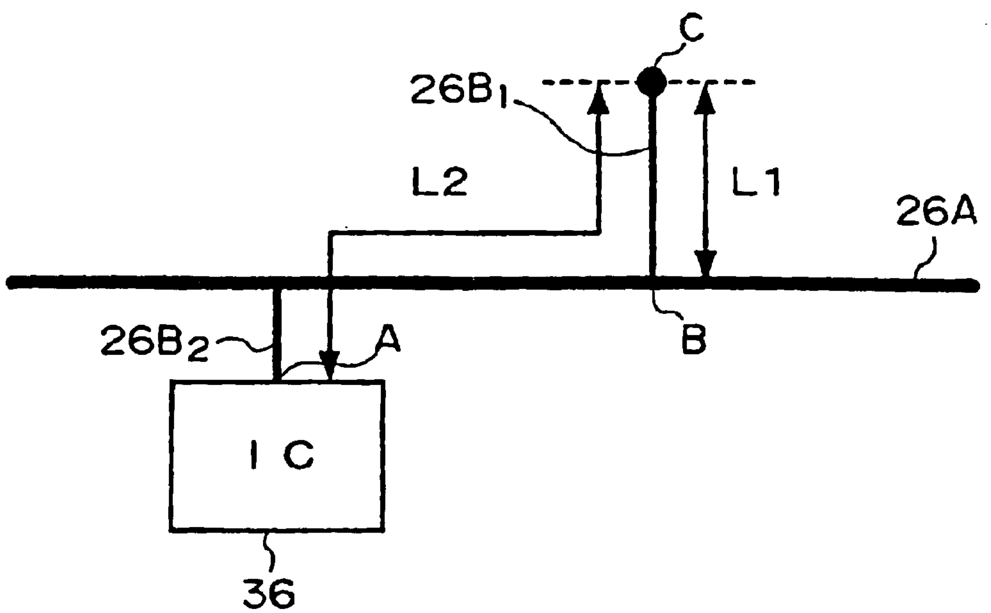
FIG. 29 is a diagram for explaining the length of the power source wire.

In the present embodiment, as shown in FIG. 29, given that the length of a first branch power source wire $26B_1$ which is branched off from the main power source wire 26A is L1, and that the length from the end portion of a second branch power source wire $26B_2$ to which the IC 36 is connected (the portion of the second branch power source wire $26B_2$ connected to the IC 36) to the end portion of the first branch power source wire $26B_1$ not connected to the main power source wire 26A is L2, L1 and L2 are set such that a predetermined relationship, by which electromagnetic wave radiation can be suppressed, between L1 and L2 is established.

In a structure such as that shown in FIG. 29, when the voltage distribution is such that the IC 36 side end portion of the branch power source wire $26B_2$ (point A in the figure) and the main power source wire 26A side end portion of the branch power source wire $26B_1$ (point B in the figure) are nodes of the voltage, and the end portion of the branch power source wire $26B_1$ at the side opposite the main power source wire 26A (point C in the figure) is the antinode of the voltage, resonance occurs, and electromagnetic wave radiation is generated.

Namely, it is easy for electromagnetic wave radiation to be generated by resonance when L1 and L2 are odd multiples of a wavelength λt which is a predetermined multiple (e.g., 1/4) of a wavelength λ of the electromagnetic wave radiation frequency which is the object, namely, when L1=n×λt and L2=m×λt (where n, m=1, 3, 5, . . . , n<m). On the other hand, in other cases, the resonance currents cancel each other out, and therefore, electromagnetic wave radiation can be suppressed.

Figure 30A:
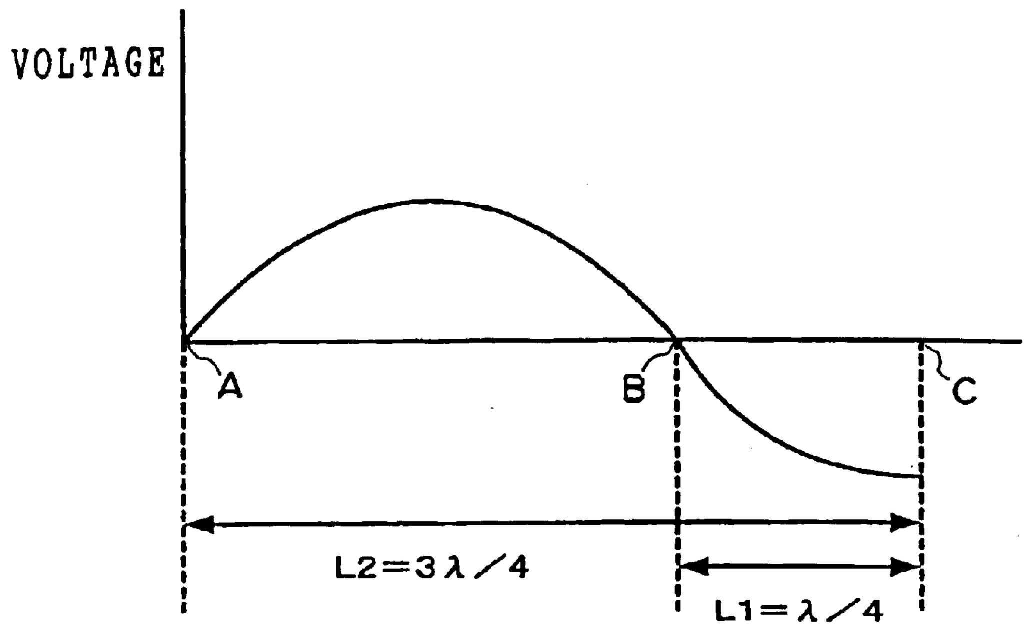
FIGS. 30A and 30B are diagrams for explaining the length of the power source wire.
Figure 30B:
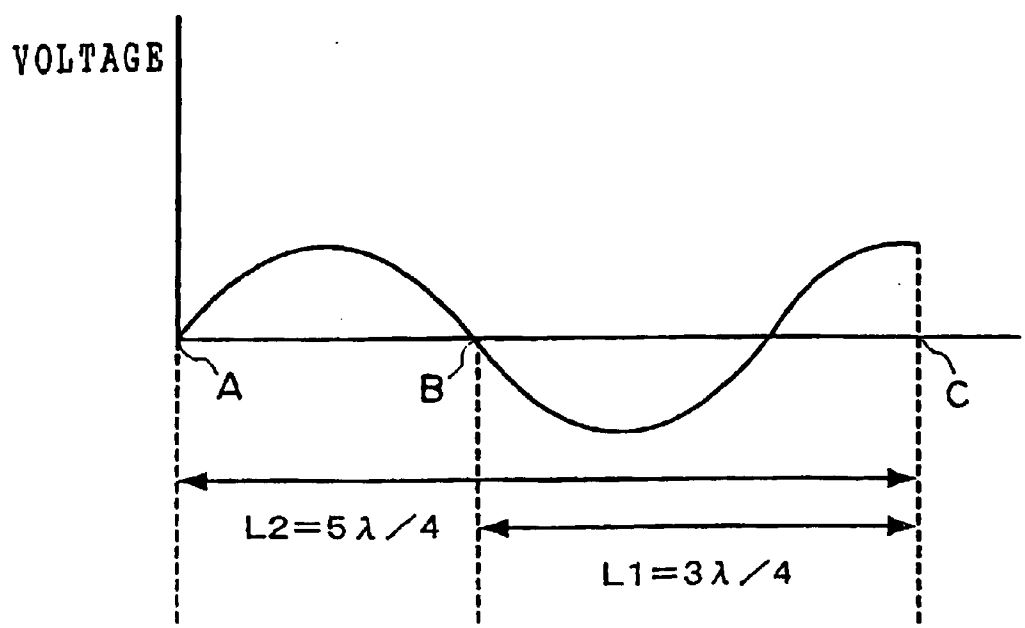

For example, in cases in which, as shown in FIG. 30A, L1 is a length which is 1 times 1/4 of the wavelength λ and L2 is a length which is 3 times λ/4, and in cases in which, as shown in FIG. 30B, L1 is a length which is 3 times λ/4 and L2 is a length which is 5 times λ/4, it is easy for electromagnetic wave radiation to be generated due to resonance.

Here, the present inventors have confirmed that, in actuality, the upper limits of n, m are limited by the wavelength λ, the size of the printed wiring board, the loss, and the like, and there is no need to consider high order resonances of the ninth order or higher. Thus, in the present embodiment, L1 and L2 are set such that n does not become an odd number of 1 to 5 and m does not become an odd number of 3 to 5.

In this way, L1 and L2 are set such that L2 becomes a dimension other than a length which is equal to L1 times an odd number m divided by an odd number n (where m=3, 5, 7; n=1, 3, 5; m>n). Namely, L1 and L2 are set such that the relation L2=(m/n)×L1 is not established. In this way, electromagnetic wave radiation can be suppressed effectively.

When a capacitance exists on the power source wire, given that the capacitance on the power source wire is C and the impedance of the power source wire is $Z_0$, a delay time $t_d$ as per the following formula arises.

$$t_d = 0.7 \times C \times Z_0 / 2 \tag{8}$$

This corresponds to the length of the power source wire becoming longer by an amount corresponding to a length $L_d = c \times t_d$ (where c is the propagation velocity). Here, the propagation velocity c is expressed by $c = 1/(Lt \times Lc)^{1/2}$, where Lt is the inductance of the power source wire per unit length, and Ct is the capacitance of the power source wire per unit length.

Here, for example, in a case in which there is a capacitance on the main power source wire 26A or the branch power source wire $26B_2$, $L_d$ is added to L2, and the respective lengths are set. In a case in which there is a capacitance on the branch power source wire $26B_1$, $L_d$ is added to each of L1 and L2, and the respective lengths are set. In this way, the electromagnetic wave radiation can be suppressed more precisely.

What is claimed is:

1. A printed wiring board in which a signal wire layer having a signal wire wired therein, and a first ground layer and a second ground layer which form ground regions, are laminated via respective insulating layers, the printed wiring board comprising:

- a plurality of interlayer connecting members electrically connecting the ground region formed by the first ground layer and the ground region formed by the second ground layer; and a power source wire wired at at least one of the first ground layer and the second ground layer, wherein the signal wire and the power source wire, which is provided at a signal wire side ground layer, are disposed such that the power source wire and a projected line of the signal wire onto the ground layer cross, and the plurality of interlayer connecting members are disposed in vicinities of both sides of the power source wire.

2. The printed wiring board of claim 1, wherein the interlayer connecting members are provided at predetermined intervals.

3. The printed wiring board of claim 2, wherein given that a propagation velocity of a standing wave on the ground region is c, a dielectric constant of the insulating layer is ∈r, and a maximum frequency of electromagnetic wave radiation which is an object is f, the predetermined interval is set to be c/(2×f×∈r1/2) or less.

4. The printed wiring board of claim 1, wherein the interlayer connecting members are further provided along at least one of a peripheral edge portion and an inner edge portion of the ground region.

5. The printed wiring board of claim 1, wherein the ground region exists at a position of a projected line of the power source wire wired at one of the ground layers, which projected line is projected onto another of the ground layers.

6. The printed wiring board of claim 1, wherein the signal wire layer is provided between the first ground layer and the second ground layer.

7. The printed wiring board of claim 1, wherein the signal wire and the power source wire, which is provided at a signal wire side ground layer, are disposed such that the power source wire and a projected line of the signal wire onto the ground layer do not cross.

8. A printed wiring board in which a signal wire layer having a signal wire wired therein, and a first ground layer and a second ground layer which form ground regions, are laminated via respective insulating layers, the printed wiring board comprising:

a plurality of interlayer connecting members electrically connecting the ground region formed by the first ground layer and the ground region formed by the second ground layer;

a power source wire wired at at least one of the first ground layer and the second ground layer; and a terminal element connected, in a vicinity of a terminal portion of the power source wire, between the power source wire and at least one ground region of the first ground layer and the second ground layer, the terminal element having an impedance which matches a characteristic impedance of the power source wire.

9. The printed wiring board of claim 8, wherein the terminal element includes a resistor and a capacitor connected in series.

10. The printed wiring board of claim 8, wherein the power source wire is formed from a main power source wire and a branch power source wire which is branched off from the main power source wire, and the terminal element is connected to a terminal portion of the main power source wire.

11. The printed wiring board of claim 10, wherein the terminal element is connected to a terminal portion of the branch power source wire.

12. The printed wiring board of claim 8, wherein the signal wire layer is formed at the same layer as at least one of the first ground layer and the second ground layer.

13. The printed wiring board of claim 8, wherein the power source wire is formed from a main power source wire and a plurality of branch power source wires which are branched off from the main power source wire, and a width of the power source wire is set on the basis of respective predetermined maximum current values of devices which are connected to the branch power source wires respectively and which are operated by power supplied from the main power source wire.

14. The printed wiring board of claim 8, wherein the power source wire is formed from a main power source wire and a plurality of branch power source wires which are branched off from the main power source wire, and a predetermined first length of a first branch power source wire, and a second length, which is from an end portion of a second branch power wire to which is connected a device which is operated by power supplied from the main power source wire, to an end portion of the first branch power source wire, are set such that the second length is a dimension other than a length equal to the first length times an odd number m divided by an odd number n (where m=3, 5, 7; n=1, 3, 5; m>n).

15. A printed wiring board in which a signal wire layer having a signal wire wired therein, and a first ground layer and a second ground layer which form ground regions, are laminated via respective insulating layers, the printed wiring board comprising:

a plurality of interlayer connecting members electrically connecting the ground region formed by the first ground layer and the ground region formed by the second ground layer; and a power source wire wired at at least one of the first ground layer and the second ground layer;

wherein the signal wire and the power source wire, which is provided at a signal wire side ground layer, are disposed such that the power source wire and a projected line of the signal wire onto the ground layer do not cross;

wherein the signal wire layer is provided at both a first ground layer side and a second ground layer side, and the power source wire is provided at both the first ground layer and the second ground layer, and a first power source wire provided at the first ground layer and a first signal wire formed on the first signal wire layer are disposed such that at least a portion of the first power source wire and at least a portion of a projected line of the first signal wire onto the first ground layer are substantially parallel, and a second power source wire provided at the second ground layer and a second signal wire formed on the second signal wire layer are disposed such that at least a portion of the second power source wire and at least a portion of a projected line of the second signal wire onto the second ground layer are substantially parallel.

16. A printed wiring board in which a signal wire layer having a signal wire wired therein, and a first ground layer and a second ground layer which form ground regions, are laminated via respective insulating layers, the printed wiring board comprising:

a plurality of interlayer connecting members electrically connecting the ground region formed by the first ground layer and the ground region formed by the second ground layer; and a power source wire wired at at least one of the first ground layer and the second ground layer;

wherein the printed wiring board includes, as the signal wire layer, a first signal wire layer and a second signal wire layer, the printed wiring board includes, as the power source wire, a first power source wire at the first ground layer and a second power source wire at the second ground layer, and the first signal wire layer is disposed adjacent to the first ground layer via the insulating layer, and the second signal wire layer is disposed adjacent to the second ground layer via the insulating layer.

17. A printed wiring board in which a signal wire layer having a signal wire wired therein, and a first ground layer and a second ground layer which form ground regions, are laminated via respective insulating layers, the printed wiring board comprising:

a plurality of interlayer connecting members electrically connecting the ground region formed by the first ground layer and the ground region formed by the second ground layer; and a power source wire wired at at least one of the first ground layer and the second ground layer, wherein the power source wire is disposed at an inner side such that the ground region is disposed between the power source wire and an end portion of the board.

18. A printed wiring board in which a signal wire layer having a signal wire wired therein, and a first ground layer and a second ground layer which form ground regions, are laminated via respective insulating layers, the printed wiring board comprising:

a plurality of interlayer connecting members electrically connecting the ground region formed by the first ground layer and the ground region formed by the second ground layer; and a power source wire wired at at least one of the first ground layer and the second ground layer, wherein the power source wire is formed from a main power source wire and a plurality of branch power source wires which are branched off from the main power source wire, and a width of the power source wire is set on the basis of respective predetermined maximum current values of devices which are connected to the branch power source wires respectively and which are operated by power supplied from the main power source wire.

19. A printed wiring board in which a signal wire layer having a signal wire wired therein, and a first ground layer and a second ground layer which form ground regions, are laminated via respective insulating layers, the printed wiring board comprising:

a plurality of interlayer connecting members electrically connecting the ground region formed by the first ground layer and the ground region formed by the second ground layer; and a power source wire wired at at least one of the first ground layer and the second ground layer, wherein the power source wire is formed from a main power source wire and a plurality of branch power source wires which are branched off from the main power source wire, and a predetermined first length of a first branch power source wire, and a second length, which is from an end portion of a second branch power wire to which is connected a device which is operated by power supplied from the main power source wire, to an end portion of the first branch power source wire, are set such that the second length is a dimension other than a length equal to the first length times an odd number m divided by an odd number n (where m=3, 5, 7; n=1, 3, 5; m>n).

* * * * *